US012776781B2

(12) United States Patent
Khoury et al.

(10) Patent No.: US 12,776,781 B2
(45) Date of Patent: Oct. 27, 2026

(54) MAINTAINING PHASE COHERENCE FOR A FRACTIONAL-N PLL

(71) Applicant: Silicon Laboratories Inc., Austin, TX (US)

(72) Inventors: John M. Khoury, Austin, TX (US); Michael Wu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 42 days.

(21) Appl. No.: 18/821,040

(22) Filed: Aug. 30, 2024

(65) Prior Publication Data

US 2024/0429926 A1 Dec. 26, 2024

Related U.S. Application Data

(63) Continuation of application No. 18/076,058, filed on Dec. 6, 2022, now Pat. No. 12,107,588.

(51) Int. Cl.
*H03L 7/099* (2006.01)
*H03B 5/32* (2006.01)

(52) U.S. Cl.
CPC ............. *H03L 7/0991* (2013.01); *H03B 5/32* (2013.01)

(58) Field of Classification Search
CPC ...... H03L 7/0091; H03L 7/081; H03L 7/1976
See application file for complete search history.

(56) References Cited

U.S. PATENT DOCUMENTS

| | | | | |
|---|---|---|---|---|
| 9,306,730 | B1 * | 4/2016 | Shu | H03L 7/081 |
| 9,344,271 | B1 | 5/2016 | Dusatko | |
| 10,895,850 | B1 | 1/2021 | Elkholy | |
| 11,303,287 | B1 | 4/2022 | Turner et al. | |
| 11,418,205 | B1 | 8/2022 | Schwarz et al. | |
| 11,901,906 | B1 | 2/2024 | Bhat et al. | |
| 2019/0173454 | A1 * | 6/2019 | Jun | H03L 7/0802 |
| 2021/0376841 | A1 * | 12/2021 | Okada | G06F 1/08 |
| 2022/0123754 | A1 * | 4/2022 | Huang | H03L 7/1976 |

OTHER PUBLICATIONS

Turner, S. and Cali, J., "Phase Coherent Frequency Hopping in Direct Digital Synthesizers and Phase Locked Loops," IEEE Transactions on Circuits and Systems—I: Regular Papers, vol. 67, No. 6, Jun. 2020, pp.

* cited by examiner

*Primary Examiner* — Sibin Chen
(74) *Attorney, Agent, or Firm* — Zagorin Cave LLP

(57) ABSTRACT

A fractional-N phase-locked loop (PLL) that maintains phase coherence for an output signal with a plurality of possible output frequencies. The fractional-N PLL includes an oscillator, a phase detector to receive a reference clock signal and a feedback signal, and a multi-modulus divider coupled in a feedback path between the oscillator and the phase detector. A multi-modulus pattern generator supplies a drive pattern to the multi-modulus divider to achieve a desired change in frequency of the output signal. The multi-modulus pattern generator initiates the drive pattern at a boundary time to cause the output signal to have a substantially repeatable phase when restarting switching from any one of the output frequencies to any other of the output frequencies.

20 Claims, 22 Drawing Sheets

| fxo (MHz) | # xo cycles | Time (μsec) |
|---|---|---|
| 38.0 | 38 | 1.0 |
| 38.4 | 192 | 5.0 |
| 39.0 | 39 | 1.0 |
| 40.0 | 40 | 1.0 |

For VCO frequencies with 100 kHz resolution (~41 ppm):

| fxo (MHz) | # xo cycles | Time (µsec) |
|---|---|---|
| 38.0 | 380 | 10.0 |
| 38.4 | 1920 | 50.0 |
| 39.0 | 390 | 10.0 |
| 40.0 | 400 | 10.0 |

For VCO frequencies with 10 kHz resolution (~4.1 ppm):

| fxo (MHz) | # xo cycles | Time (µsec) |
|---|---|---|
| 38.0 | 3800 | 100.0 |
| 38.4 | 19200 | 500.0 |
| 39.0 | 3900 | 100.0 |
| 40.0 | 4000 | 100.0 |

$$STF(z) = \frac{1+H}{1+H} = 1$$

$$STF(z) = \alpha + (1 - \alpha)z^{-1}$$
For $\alpha = 1$: $I(z) = 0$
For $\alpha = 0$: $I(z) = z^{-1}X(z)$ $$STF(z) = \frac{\alpha_2+(\alpha_1-2\alpha_2)z^{-1}+(1-\alpha_1+\alpha_2)z^{-2}}{1+(\beta_2-2)z^{-1}+(1+\beta_1-\beta_2)z^{-2}} = 1$$

$$NTF(z) = \frac{(1-z^{-1})^2}{1+(\beta_2-2)z^{-1}+(1+\beta_1-\beta_2)z^{-2}} = (1-z^{-1})^2$$

For:

$\alpha_1=2$ $\alpha_2=1$ $\beta_1=1$ $\beta_2=2$

MAINTAINING PHASE COHERENCE FOR A FRACTIONAL-N PLL

CROSS-REFERENCE TO RELATED APPLICATIONS

This application is a continuation of U.S. patent application Ser. No. 18/076,058, filed Dec. 6, 2022, entitled "Maintaining Phase Coherence for a Fractional-N PLL," naming John M. Khoury and Michael Wu as inventors, which application is incorporated herein by reference in its entirety.

BACKGROUND

Field of the Invention

This disclosure relates to maintaining phase coherence in output signals generated by a fractional-N phase-locked loop.

Description of the Related Art

Many applications such as radar and Bluetooth Low Energy (BLE) High Accuracy Distance Measurements (HADM) benefit from knowing precisely the phase of an output signal of a phase-locked loop (PLL) and how that phase relates to the phase of a reference clock signal being supplied to the PLL and to other frequencies that the PLL may generate. Knowing the phase accurately improves the performance of such applications and thus improvements in maintaining phase coherence when switching between frequencies would be desirable.

SUMMARY OF EMBODIMENTS OF THE INVENTION

In one embodiment an apparatus includes a fractional-N phase-locked loop (PLL) that generates an output signal having one of a plurality of output frequencies. The fractional-N PLL includes an oscillator, a phase detector to receive a reference clock signal and a feedback signal, and a multi-modulus divider coupled in a feedback path between the oscillator and the phase detector. A multi-modulus pattern generator supplies a drive pattern to the multi-modulus divider to achieve a desired change in frequency of the output signal. The multi-modulus pattern generator initiates the drive pattern at a boundary time to cause the output signal to have a substantially repeatable phase when switching from any one of the output frequencies to any other of the output frequencies.

In another embodiment a method for generating an output signal includes supplying a multi-modulus drive pattern to a multi-modulus divider of a fractional-N phase locked loop to achieve a desired change in frequency of the output signal from a first frequency of a plurality of output frequencies to a second frequency of the plurality of output frequencies. The method further includes initiating supplying the drive pattern at a boundary time to thereby cause the output signal to have a substantially repeatable phase when switching the output signal from any one of a plurality of output frequencies to any other of the plurality of output frequencies In another embodiment an apparatus includes a fractional-N phase-locked loop (PLL) that generates an output signal having one of a plurality of output frequencies and the PLL is coupled to receive a reference clock signal. A pattern generator supplies respective drive patterns to a multi-modulus divider of the PLL. The respective drive patterns correspond to the plurality of output frequencies. The pattern generator initiates supplying the respective drive patterns at respective boundary times, each of the respective boundary times separated from a previous boundary time by a boundary time interval corresponding to a predetermined number of reference clock cycles.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

For phase coherence, if a PLL output signal is tuned from one frequency to a different output frequency, it is desirable that the phase of the output signal be deterministically related to the phase of the reference clock signal as well as the other possible frequencies produced by the PLL. As an example, if the PLL is putting out a frequency f1 at a known phase and then the PLL is re-programmed to put out a frequency f2 at a known phase relationship to the reference clock (and to f1), if the PLL is reprogrammed back to frequency f1, the phase of the f1 clock signal should be the same as if the change from f1 to f2 to f1 was never made. The property of phase coherence is valuable in such applications as radar systems and BLE one-way HADM. While one-way and two-way HADM approaches exist that ease or avoid phase coherence requirements, having known and predictable phase coherence over time has benefits including allowing use of arbitrary frequencies across the frequency band and random hopping between frequencies. Random hopping between frequencies is required for certain applications. Phase coherence is also valuable for asset tracking applications since a predictable phase allows more averaging at different frequencies between tag and locator to reduce phase error and improve the resulting distance calculation.

Figure 1:
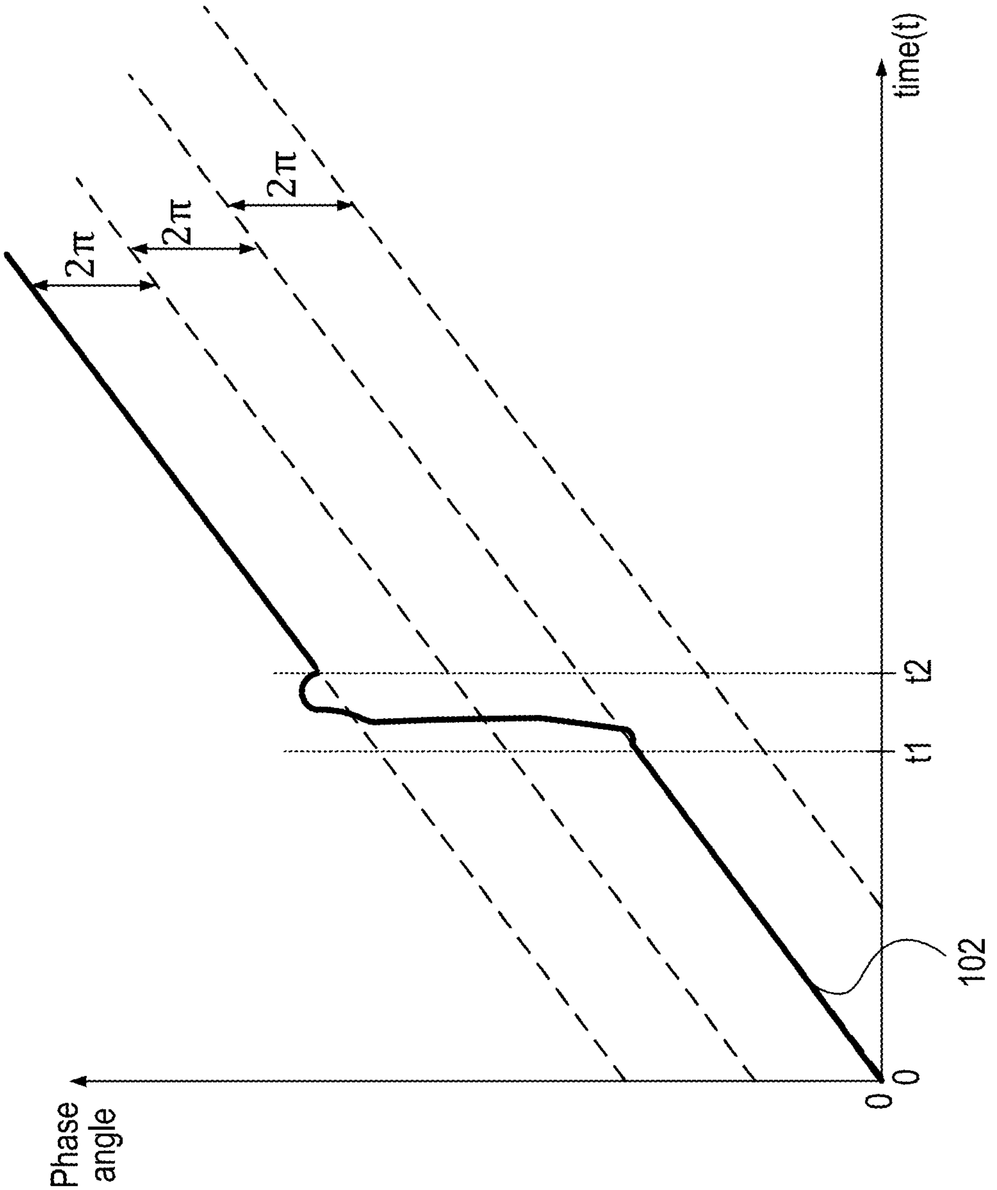
FIG. 1 illustrates graphically the notion of phase coherence.

FIG. 1 illustrates graphically the notion of phase coherence showing unwrapped phase angle versus time for a signal that starts at time t=0 with a phase angle of 0. For phase coherence, the phase angle versus time is always on a trajectory that is k*2π offset from the initial trajectory 102 at t=0, where k is an integer In FIG. 1, the phase trajectory can be arbitrary between t1 and t2, provided phase coherence is only required for times $t<t1$ and $t>t2$.

Figure 2:
FIG. 2 shows an open loop voltage controlled oscillator (VCO).
Figure 3:
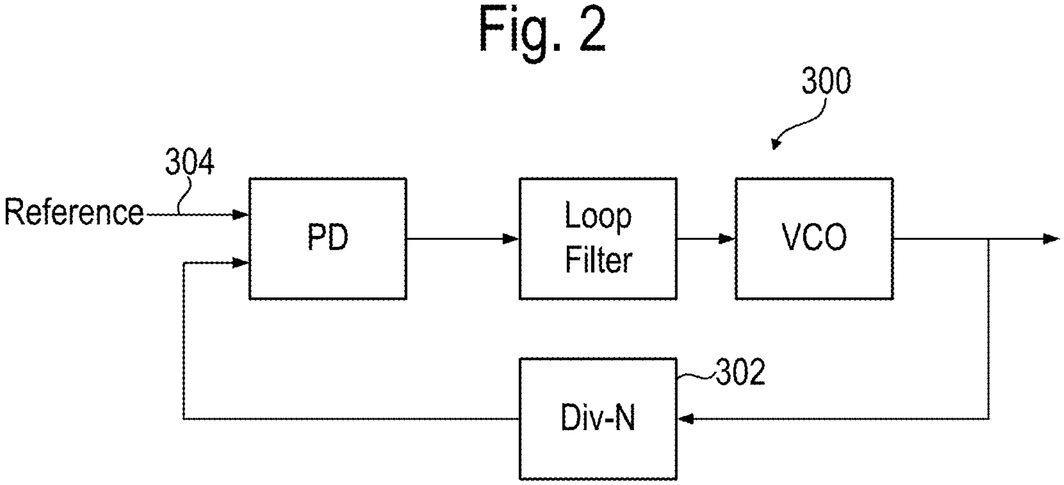
FIG. 3 shows an integer-N phase-locked loop (PLL).

Referring to FIG. 2, for an open loop voltage controlled oscillator (VCO) 201, a transient at the VCO input that eventually returns to the correct value of Vin forces loss of phase coherence for all time. After the transient subsides, the VCO frequency is correct but the phase is random with respect to the previous phase of the VCO before the transient. For the integer-N PLL 300 shown in FIG. 3, where the feedback divider 302 is a fixed integer N, a transient at the VCO input will not cause a loss of long-term phase coherence. PLL feedback will cause the output signal to re-align and lock the phase of the VCO output signal to the reference signal 304. In steady state, the VCO edge position with respect to the reference signal rising edge can be exactly predicted. In steady state, the phase of the output signal will be within k2π of the prior output signal phase, where k is an integer. Thus, maintaining phase coherence is not an issue with integer N PLLs because the feedback divider has no memory.

Figure 4:
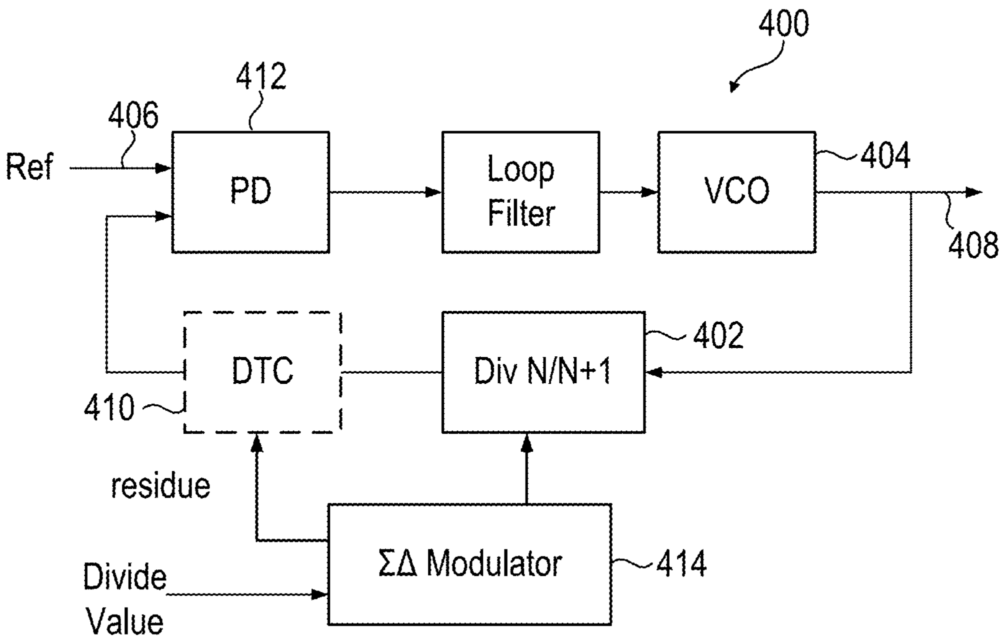
FIG. 4 illustrates a fractional-N phase-locked loop (PLL).

In contrast, a fractional-N PLL achieves a fractional divide ratio (e.g., 64.123) by toggling between divide ratios (e.g., 64 and 65). A residue error accumulates over time (e.g., accumulated error at time, t, versus the target of 64.123) and thus the fractional-N PLL has memory. Referring to FIG. 4, the fractional-N PLL 400 includes a multi-modulus divider (MMD) 402 that divides the signal fed back from the VCO 404 by N or N+1 to achieve the desired fractional divide result. However, for the traditional fractional-N PLL shown in FIG. 4, in steady state, knowing the edge of the reference clock signal 406 cannot be used to predict the position of the edge of the VCO output signal 408. For the traditional fractional-N PLL illustrated, the position of the edge of the VCO output signal determines the phase. The MMD 402 is constantly swallowing an "average" number of VCO cycles and the edge of the VCO output signal is constantly "walking" with respect to the edge of the reference clock signal. In an embodiment, an optional digital to time converter (DTC) 410 removes the residue from the feedback signal supplied to the phase detector (PD) 412. The history of the N/N+1 division sequence determines the VCO output signal phase with respect to the reference clock signal phase. That is, the feedback network has memory. Thus, the MMD has a history that must be maintained or recreated to maintain phase coherence. In steady state, the feedback network determines the phase of the VCO output signal with respect to the reference clock signal. In a fractional-N PLL, the history of the divisions by N, N+1 as controlled by the ΣΔ modulator 414 and resulting residue determines the phase of the VCO. If the PLL 400 is turned off and then sometime later turned on, the goal is to have the phase of the VCO output signal return to its original value. That assumes that the reference signal stays powered up and maintains its phase coherence. Another goal is for the fractional-N PLL to generate many frequencies (also referred to herein as tones) and to maintain a known phase relationship between all frequencies. To control phase coherence, that memory must be maintained or must be reset to zero and the system restarted at specific time instants that replicates the system condition at t=0.

Embodiments described herein maintain phase coherence when switching from f1 to f2 and back to f1 and also maintains a known phase relationship between f1 and f2 by referring back to the reference clock. As described herein, the state-variables of the sigma-delta (ΣΔ) modulator (e.g., the accumulators) are reset to zero before a new frequency is generated. However, in an embodiment, the reset and initiation of patterns supplied by the ΣΔ modulator are performed at a specific instant in time. The time instant is a function of the reference frequency and the output frequencies that the PLL needs to produce.

Figure 5:
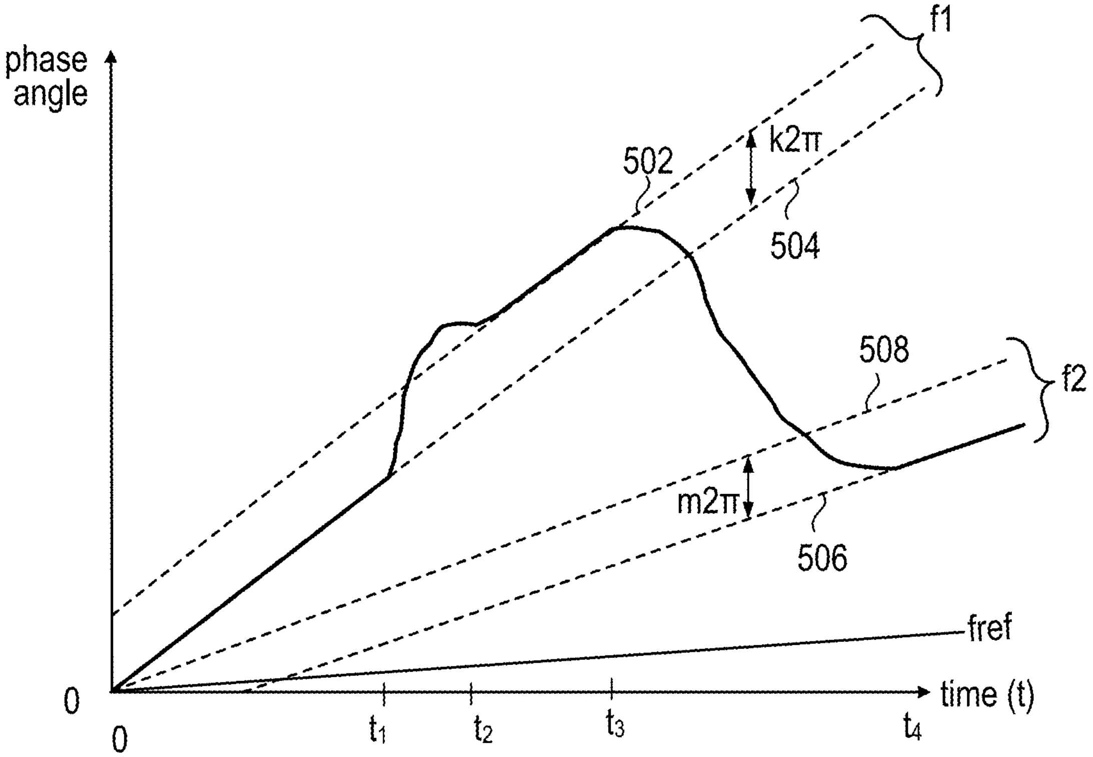
FIG. 5 illustrates graphically the goal of switching from a first frequency to a second frequency with phase coherence.

FIG. 5 illustrates the goal of switching from frequency f1 to f2 and with the phase of f2 being as if f2 started at t=0. Frequencies f1 and f2 have a known and fixed relationship to each other and to the reference clock signal (fref). In the simplest approach the phases of f1 and f2 equal zero when the phase of fref is zero. That is, all the tones start at t=0 and have zero phase at t=0. Phase coherence of fref is assumed to be guaranteed by the crystal oscillator supplying the reference clock signal fref. The PLL produces tone f1 at t=0. A transient occurs between t1 and t2, but phase coherence is maintained for f1. Between t3 and t4, PLL switches to tone f2 and after t4 the PLL maintains phase coherence as if f2 was running since time t=0. The trajectory 502 for f1 is k2π offset from the trajectory 504 for the tone f1, which started at t=0. Similarly, the trajectory 506 for the tone f2 is m2π away from the trajectory 508 that started at t=0, where k and m are integers.

Figure 6:
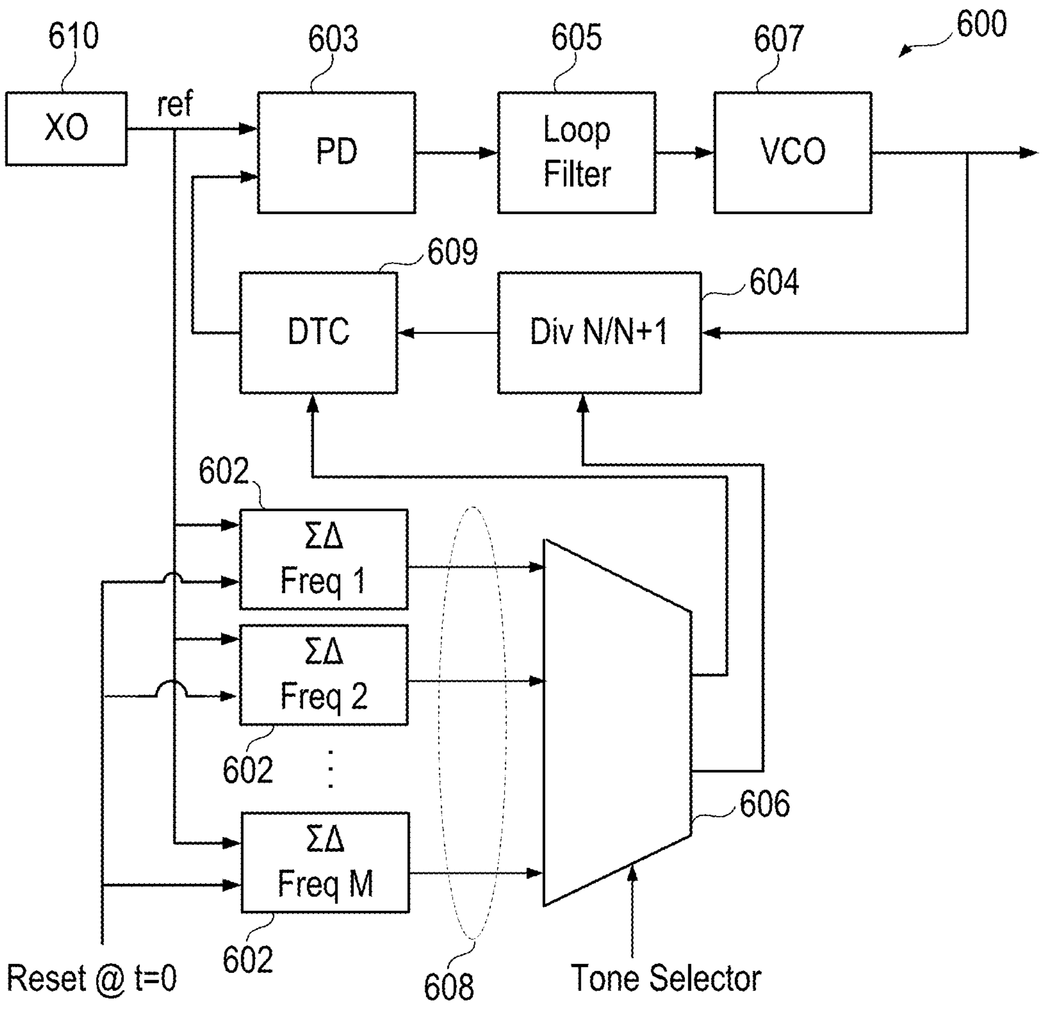
FIG. 6 illustrates a brute force solution to provide M tones having a zero phase at t=0.

FIG. 6 illustrates a brute force solution to provide tones having a zero phase at t=0. One of the plurality of M ΣΔ modulators 602 control the MMD 604 of the fractional-N PLL 600 depending on the frequency, where M is an integer. The PLL 600 includes a phase detector (PD) 603, the loop filter 605, and the voltage controlled oscillator (VCO) 607. In the embodiment of FIG. 6, a digital-to-time converter (DTC) 609 removes jitter from the feedback signal supplied to the PD 603. The ΣΔ modulators 602 are reset and started at time t=0. The selector circuit 606 selects which of the ΣΔ modulator outputs 608 is supplied to the MMD 604. The PLL can switch between any of the M tones and their relative phase difference will remain coherent after the loop filter (typically a low pass filter) 605 settles. The PLL 600 can be powered down and up and still maintain absolute phase relationships provided that the crystal oscillator (XO) 610 supplying the reference frequency keeps running along with all the ΣΔ modulators 602. If there is a ΣΔ modulator for each BLE frequency, there would require nearly 80 ΣΔ modulators for HADM applications. Note that BLE transmits data on carriers spaced by 2 MHz, but Bluetooth classic uses 1 MHz spacing. BLE HADM also uses 1 MHz spacing of tones. The ΣΔ modulators can all be powered down and restarted at the same time and the relative phase coherence between tones will be maintained, but not their phase relationship with themselves from the previous powered up state. The brute force solution while easy to implement requires significant silicon area compared to other solutions and requires power expenditure to keep all the ΣΔ modulators 602 running even when the PLL 600 is not needed and powered down.

Figures 7, 8:
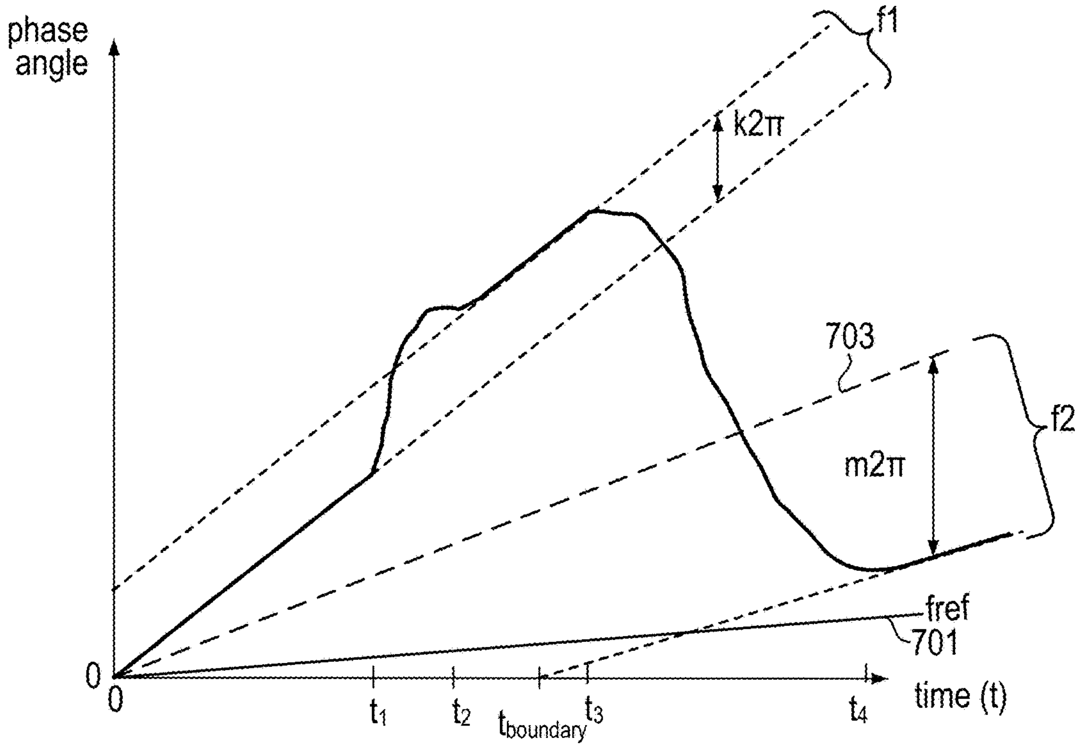
FIG. 7 illustrates graphically an approach to switch to a new frequency at a time that is equivalent to t=0 that does not require that all the CA modulators for all tones always run even when the PLL is off.
FIG. 8 illustrates the number of XO cycles to achieve a 1 μs or integer multiple of 1 μs for various XO frequencies.

Accordingly, it would be desirable to start a ΣΔ modulator for a new target frequency at a time that is equivalent to t=0 that would not require all the ΣΔ modulators for all tones to always run even when the PLL is off. FIG. 7 illustrates such an approach. In an embodiment represented by FIG. 7, it is not necessary to start all M modulators at t=0. Instead, more efficient embodiments start the ΣΔ modulator(s) at times at which all the BLE (or other RF standard) frequencies and the reference clock frequency are equivalent to t=0. In an embodiment the reference clock signal is supplied by a crystal oscillator. Other embodiments may use a different source for the reference clock signal, e.g., a micro electromechanical system (MEMS) oscillator. Starting the ΣΔ modulator for a particular tone at a time that is equivalent to t=0 guarantees that each tone has a known phase relationship with every other tone and with the reference clock signal. In an embodiment supporting BLE, all BLE frequencies are on a 1 MHz raster (2402, 2403, 2404, . . . 2480 MHz). In a 1 μsec interval there are an integer number (2402, 2403, 2404, . . . 2480) of oscillator cycles. If at t=0, the oscillator frequencies are started with zero phase, all the VCO angles return back to zero every 1 μsec. In order to determine when a t=0 equivalent time occurs, the system needs to determine how many XO cycles are needed to fall on a 1 μsec boundary or an integer multiple of 1 μsec. Of course there can be different XO frequencies depending, e.g., on the crystal used and it is useful to know the number of XO cycles for the possible XO frequencies used for any particular embodiment. FIG. 8 illustrates the number of XO cycles to achieve a 1 μs or integer multiple of 1 μs for various XO frequencies. For example, for a 38.4 MHz XO frequency, it takes 192 XO cycles to reach the integer multiple of 5 μs and for a 39 MHz XO frequency it takes 39 XO cycles to reach a 1 μs boundary. Note that embodiments described herein assume that the BLE frequencies occur every 1 MHz and given the reference clock frequency, this defines the boundaries. However, the approach described herein is not limited to frequencies spaced 1 MHz apart but works for other equally spaced frequencies.

Referring back to FIG. 7, at t=0, fref 701 has zero phase. At t=0, f1 is initialized with zero phase by starting the ΣΔ modulator with reset states and residue set to zero. The PLL produces tone f1 at t=0. A transient occurs between t1 and t2, but phase coherence is maintained for f1. At t=t_boundary, f2 is initialized to zero phase by starting its ΣΔ modulator in a reset state with zero residue. The frequency f2 starts at t=t_boundary and starts with zero phase. Both fref and f1 should also be at zero phase at t_boundary (assuming the angle is properly wrapped). The time t_boundary is thus a proxy for t=0. Starting the ΣΔ modulator for f2 at t_boundary allows f2 to maintain phase coherence as if f2 had started at t=0 as indicated by the dotted line 703. Each t_boundary is separated from an immediately preceding t_boundary by a boundary time interval that ensures that each t_boundary is equivalent to t=0. The boundary time interval between boundary times depends on the frequency of the XO, the BLE frequencies, and the desired VCO resolution.

Figure 9:
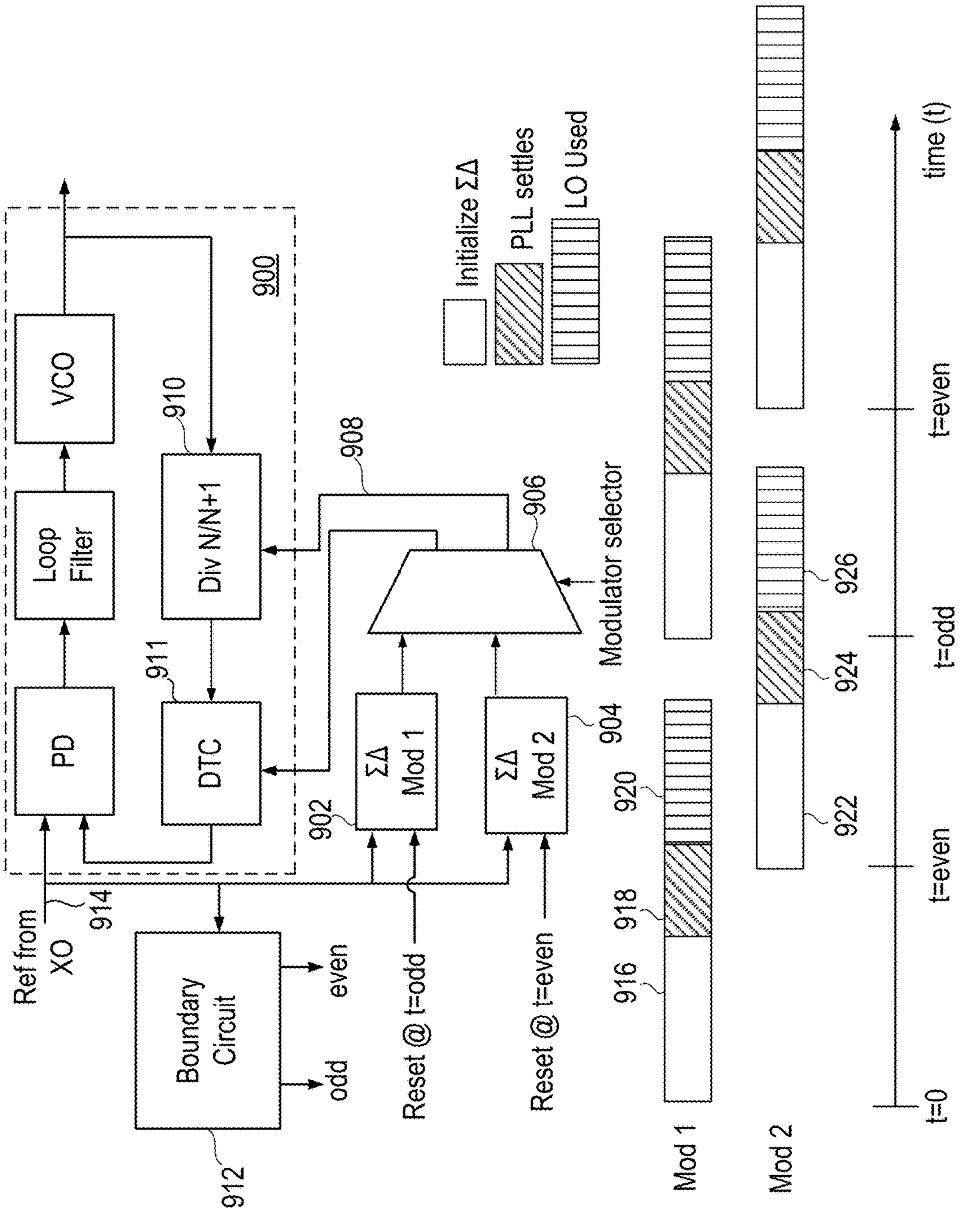
FIG. 9 illustrates an embodiment that uses two ΣΔ modulators to generate all the local oscillator (LO) frequencies.

Thus, ΣΔ modulators for each frequency continuously running are not required if the appropriate t_boundary is properly selected to start the ΣΔ modulator supplying the divide values for the desired frequency. FIG. 9 illustrates an embodiment that uses ΣΔ modulators 902 and 904, one of which is active, by supplying divide values to the multi-modulus divider of the PLL 900 to generate BLE local oscillator (LO) frequencies. The embodiment of FIG. 9 includes a backup 24 modulator (either 24 modulator 902 or 904) to minimize the time to transition to a new frequency as described further below. The embodiment of FIG. 9 includes a selector circuit 906 to supply the divider control signal 908 to the MMD 910 and to the DTC 911 from the active ΣΔ modulator. A boundary circuit 912 counts XO cycles to determine the proxies for t=0 based on the frequency of the XO reference clock signal 914. In the embodiment of FIG. 9, the boundary circuit 912 supplies odd and even signals corresponding to odd and even boundary times that are proxies for t=0. Thus, each odd and even signal asserts every M2π. For example, for a 38.4 MHz XO, the odd signal from boundary circuit 912 asserts every 10 μs and the even signal from boundary circuit 912 asserts every 10 μs, but the odd signal and even signals assert 5 μs apart since a phase boundary equivalent to t=0 occurs every 5 μs. For a 38 MHz XO, the odd signal from boundary circuit 912 asserts every 2 μs and the even signal from boundary circuit 912 asserts every 2 μs, but the odd and even signals assert 1 μs apart since a phase boundary equivalent to t=0 occurs every 1 μs. Of course those times may differ based on the desired resolution.

FIG. 9 also illustrates the utilization of an active and backup ΣΔ modulator to improve transition times. ΣΔ modulator 902 is assumed to be the first active modulator reset and initiated at boundary t=0. The state variables of the ΣΔ modulator are reset to zero or other known state prior to supplying the patterns to the MMD. After the initialization period 916, the PLL settles for a time period 918 and then the PLL output is used as the local oscillator (LO) signal for RF operations during 920. Once a new target frequency is known, the backup ΣΔ modulator 904 is initialized (state variables reset to zero or other known state) on an even 1 μsec (or 5 μsec) boundary well in advance of when it is needed. The backup modulator is activated to drive the MMD, digital to time converter (DTC), quantitative noise cancellation (QNC), etc., to affect the desired frequency change. Thus, ΣΔ modulator 904 is initiated at t-even for time period 922. The PLL settles during 924 and the PLL output signal is used as the LO signal during 926. That sequence continues with the ΣΔ modulator 902 being reset and initialized at odd boundaries and ΣΔ modulator 904 being initialized at even boundaries when a frequency change is desired. When no frequency change is desired and not active the backup modulator can remain powered down. While the embodiment of FIG. 9 utilizes two ΣΔ modulators, other embodiments can utilize a single ΣΔ modulator if the added delay to switch to a new frequency is acceptable for the particular application. While the single modulator is being configured for the new frequency, the PLL would not provide an output usable by the LO. Other embodiments may utilize more than two modulators.

Figure 10:
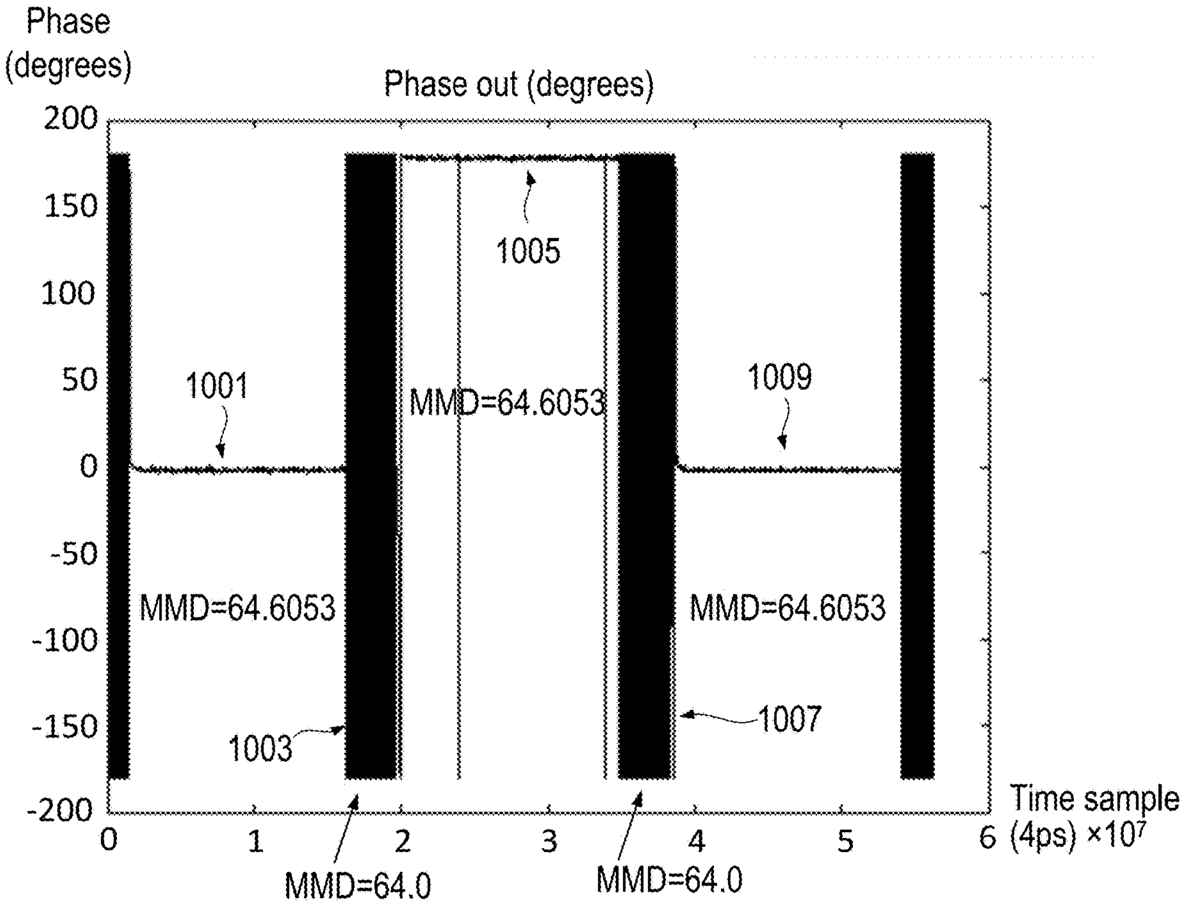
FIG. 10 illustrates the difference in phase output when initializing the ΣΔ modulator on boundaries equivalent to t=0 and other boundaries.

FIG. 10 illustrates the difference in the phase output between initializing the ΣΔ modulator on boundaries equivalent to t=0 and other boundaries. In FIG. 10, the results are based simulations with a reference clock signal of 38 MHz and a PLL output frequency of 2455.0 MHz. The horizontal axis is time samples with each sample being 4 picoseconds. Generating that output frequency utilized a divide by 64.6053 for the multi-modulus divider. With the ΣΔ modulator initialized at t=0, the phase at 1001 is approximately 0°. With the ΣΔ modulator disabled, the feedback divider divides by 64 to produce an output frequency of 2432 MHz at 1003. The ΣΔ modulator is initialized at 0 usec, 75.5 μsec, and 150 μsec. When initialized at 75.5 usec the phase can be seen at 1005 to be approximately 175°. With the ΣΔ modulator again disabled, the feedback divider divides by 64 to produce an output frequency of 2432 MHz at 1007. When initialized at 150 μsec, a boundary condition equivalent to t=0 that maintains phase coherence, the output phase is maintained at 1009 at ~0° as if the ΣΔ modulator started at t=0. Thus, the output phase is repeated when the ΣΔ modulator initializes at an appropriate boundary condition equivalent to t=0. Thus, memory is removed from the MMD by controlling/initializing the sigma-delta modulator(s) at specific boundary times that are separated by a fixed boundary time interval. Note that if the reference frequency is in error by X parts per million (ppm), the VCO output will also be in error by X ppm. The approach to start on appropriate boundary conditions still works provided the boundaries are derived by reference cycle counts, not absolute time.

Figures 11, 12:
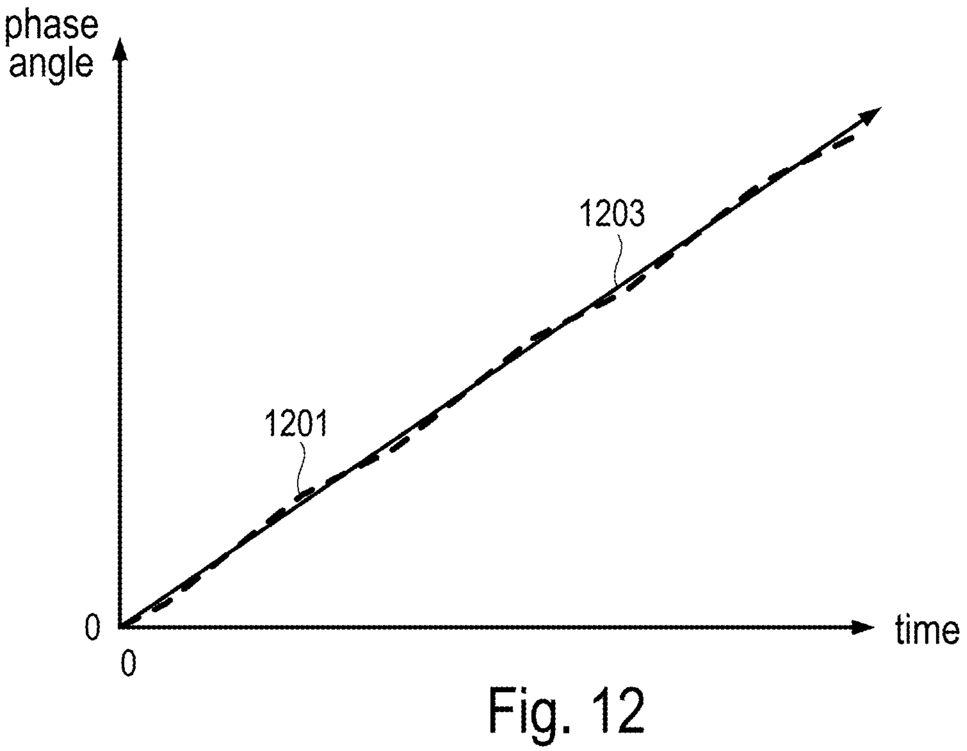
FIG. 11 illustrates boundary time intervals in XO cycles and time for various XO frequencies for different VCO resolutions.
FIG. 12 illustrates a linear minimum mean square error (MMSE) fit to an ideal VCO angle to generate drive patterns for the multi-modulus divider (MMD) of the PLL.

The VCO frequencies can be adjusted to a finer resolution than 1 MHz. For example, for a 1 μsec boundary a 38 MHz reference clock has 38 cycles. A 2455 MHz signal has 2455 cycles and a 2455.1 MHz has 2455.1 cycles. For a boundary time occurring every 10 μsec, a 38 MHz reference clock has 380 cycles, a 2455.0 MHz signal has 24550 cycles, and a 2455.1 MHz signal has 24551 cycles. FIG. 11 illustrates XO cycles and time for boundary times for various XO frequencies for VCO frequencies with 100 kHz resolution (approximately 41 ppm) and 10 kHz (approximately 4.1 ppm) resolution. Finer incremental resolution can be achieved if the defined boundaries are less frequent.

Referring to FIG. 12, a different approach to drive the MMD uses the concept of a linear minimum mean square error (MMSE) fit to an ideal VCO angle (unwrapped) versus time. Instead of using a ΣΔ pattern to control the MMD, an embodiment uses a sequence to minimize the mean square error of the approximated VCO angle versus time, against the ideal angle versus time. If successful, a linear polynomial fit to the desired sequence has a y-intercept of zero (phase) and the desired slope (i.e., frequency). Here t=0, corresponds to the defined boundary (e.g., every 1 μsec) for which all VCO phases of desired frequencies and the reference phase align (nominally at zero degrees). In FIG. 12, the line segment 1201 are N or N+1 angle accumulations for each reference cycle. N or N+1 is chosen for a given reference cycle to minimize the cumulative mean square error versus the target VCO angle 1203.

The goal is for the VCO phase $\theta_{vco}$=[N+nfrac]$\theta_{ref}$. However, without a DTC or QNC any non-zero long term average of the residue will cause an unexpected phase shift in the PLL output. That is, $\theta_{vco}$=[N+nfrac]$\theta_{ref}$+2π(res)$_{avg}$. Careful design of the MMD drive patterns can satisfy both the desired output frequency and phase provided that the residue is controlled. One option is to leave the phase offset as it is and for use for one-way HADM distance calculations simply subtract out this deterministic error. However, that would require all vendors to have the same offset or the phase offset data needs to be transmitted to the far-end device. Another option is to use a DTC (or QNC) to remove the average phase offset as well as peak to peak variations but the DTC (or QNC) range could be quite large, and process voltage temperature (PVT) variations make the implementation for such a solution more difficult. A third option described further herein is to design the MMD drive patterns to have zero average residue and thus zero phase offset.

The following describes MMD pattern analysis for the fractional value nfrac and average residue $(res)_{avg}$ where p(j) is a 1 or 0 corresponding to N or N+1:

$$nfrac = \frac{1}{K}\sum_{j=1}^{K} p(j)$$

$$res(k) = k * nfrac - \sum_{j=1}^{k} p(j)$$

$$(res)_{avg} = \frac{(M+1)}{2} nfrac - \frac{1}{M}\sum_{k=1}^{M}\sum_{j=1}^{k} p(j)$$

The goal is to have zero average residue. For a large M, to have zero average residue:

$$\sum_{j=1}^{M} p(j) \sim nfrac * M \text{ for } p(j) = 0, 1$$

$$\sum_{j=1}^{M} jp(j) \sim \frac{M(M+1)}{2} nfrac$$

In order to achieve zero mean residue, the value of p(j) matters and also its position in the sequence.

For a large M:

$$\sum_{j=1}^{M} jp(j) \sim \frac{(M+1)}{2}\sum_{j=1}^{M} p(j)$$

$$\sum_{j=1}^{M} p(j)\left[j - \frac{M+1}{2}\right] \sim 0$$

With a change of variable of $$n = j - \frac{M+1}{2}$$

$$\sum_{n=-\frac{M-1}{2}}^{\frac{M-1}{2}} p\left(n + \frac{M+1}{2}\right)n \sim 0$$

The above equation is easily met, provided that p $$\left(n + \frac{M+1}{2}\right)$$

is an even function.

Figure 13:
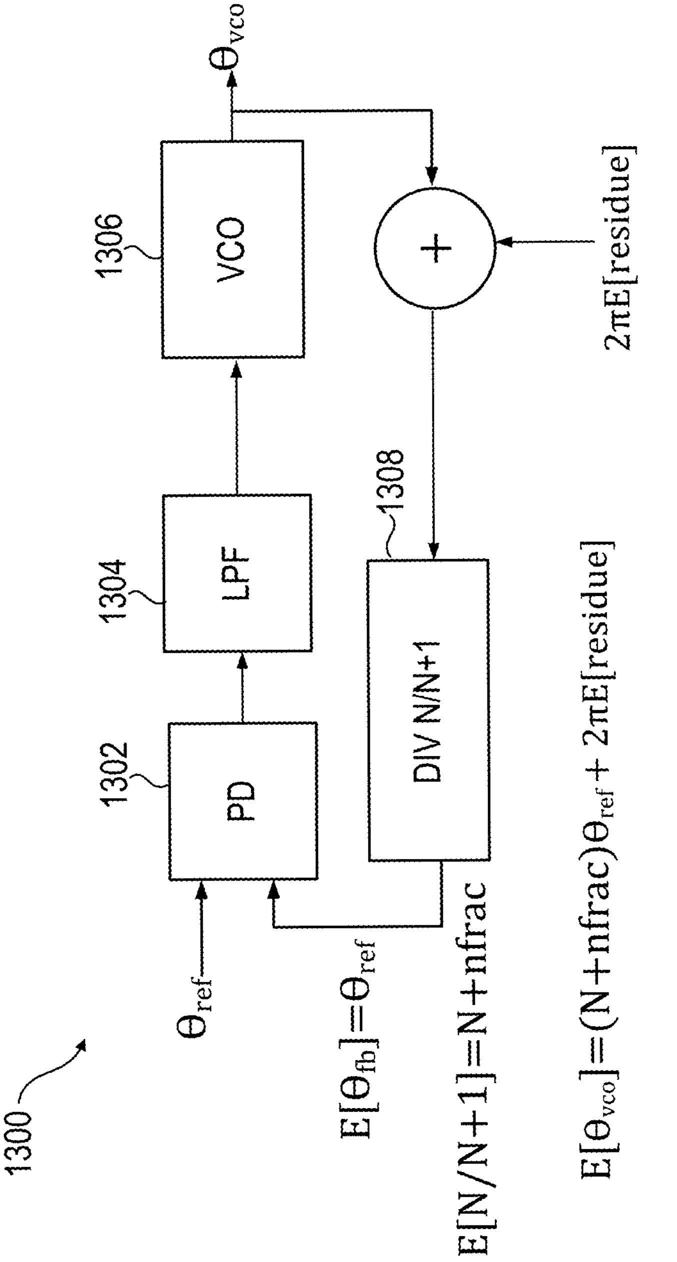
FIG. 13 illustrates why an average residue of zero is required.

FIG. 13 illustrates another view of why an average residue of zero is required. The PLL 1300 includes a phase detector (PD) 1302, LPF 1304, VCO 1306 and generates a VCO output signal with a phase $\theta_{VCO}$. The residue history 2πE [residue] is summed with the VCO output signal and supplied to the MMD 1308. Assume the PLL bandwidth is ~1 Hz (i.e. an infinitesimal bandwidth). The average or expected values of $E[\theta_{fb}]=\theta_{ref}$. The LPF 1304 supplies a nominally DC voltage when fully settled. The expected value E[N/N+1]=N+nfrac. The expected phase of the VCO is $E[\theta_{VCO}]=(N+nfrac)\theta_{ref}+2\pi E[residue]$. A residue of 0 assures the VCO output phase is $E[\theta_{VCO}]=(N+nfrac)\theta_{ref}$.

Figure 14:
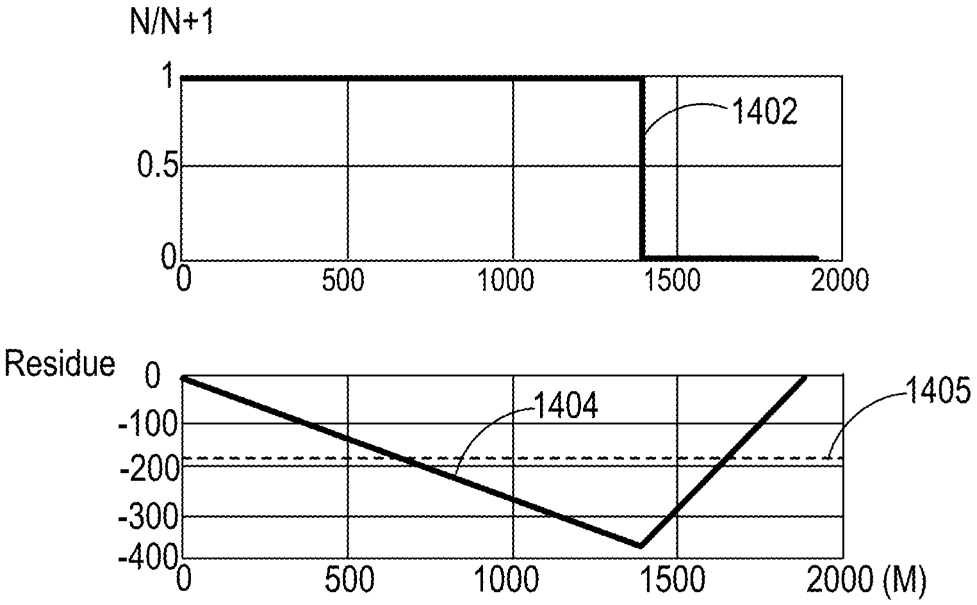
FIG. 14 illustrates a simple pulse width modulated pattern to drive the MMD and the resulting residue versus time.

FIG. 14 illustrates a simple pulse width modulated (PWM) pattern to drive the MMD assuming a reference frequency fref=38 MHz, the frequency of the VCO fvco=2460 MHz, and M=1900. The PWM pattern is shown at 1402 with nfrac=0.7368 and residue 1404. The mean residue 1405 is −184.21. One difficulty is that the VCO is slowly moving between two frequencies, which requires a very low bandwidth PLL to alleviate. The second problem is that the average residue is non-zero, which introduces a phase error unless a DTC is used to remove the average phase error. Alternatively, the pattern can be modified to overcome those problems.

Figure 15:
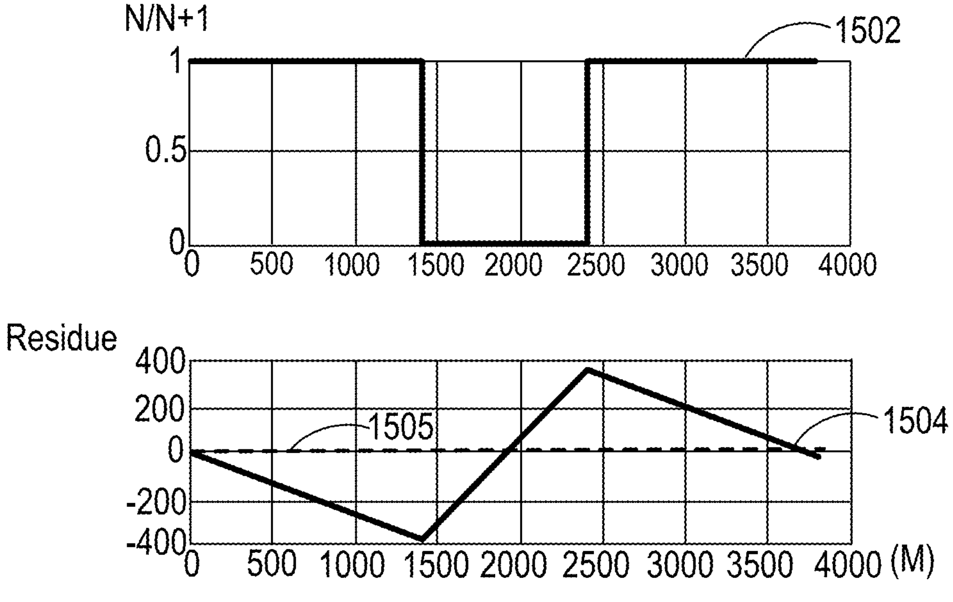
FIG. 15 illustrates a modified pattern in which the PWM pattern is flipped and added to the original pattern to modify the mean residue.

FIG. 15 illustrates a modified pattern in which the PWM pattern is flipped and added to the original pattern as shown at 1502 to create an even function around the "flipped" time. The fractional value nfrac=0.7368 with the reference frequency fref=38 MHz and the frequency of the VCO fvco=2460 MHz. With the flipped PWM pattern, M=3800 or twice the original M.

The PWM pattern 1504 creates the correct value for nfrac and the average residue 1505 is zero since the modified pattern is an even function. However, the VCO is slowly moving between two frequencies. The average residue is zero but has low frequency content. The approach of FIG. 15 requires an extremely low bandwidth PLL to mitigate both issues.

Several approaches can be used for MMD pattern modification. Pattern creation can use any of a number of pattern generation approaches such as using a ΣΔ modulator or an MSE fit approach described earlier. Assume the original pattern is: [p(1) p(2) p(3) p(4) . . . p(M)].

The modified pattern can be flipped and added to the original pattern. The flipped pattern is an even function and removes DC offset of the residue. The flipped pattern is: [p(1) p(2) p(3) p(4) . . . p(M) p(M) p(M−1) . . . p(2) p(1)]

The flipped pattern can also be interleaved. The interleaved pattern removes the low frequency content of the residue and the pattern is also even. The interleaved pattern is: [p(1) p(M) p(2) p(M−1) . . . p(M) p(1)]

Optionally, the interleaved pattern can be cut in half to maintain the original pattern length. The original pattern is long enough to generate the correct value of nfrac.

Figure 16A:
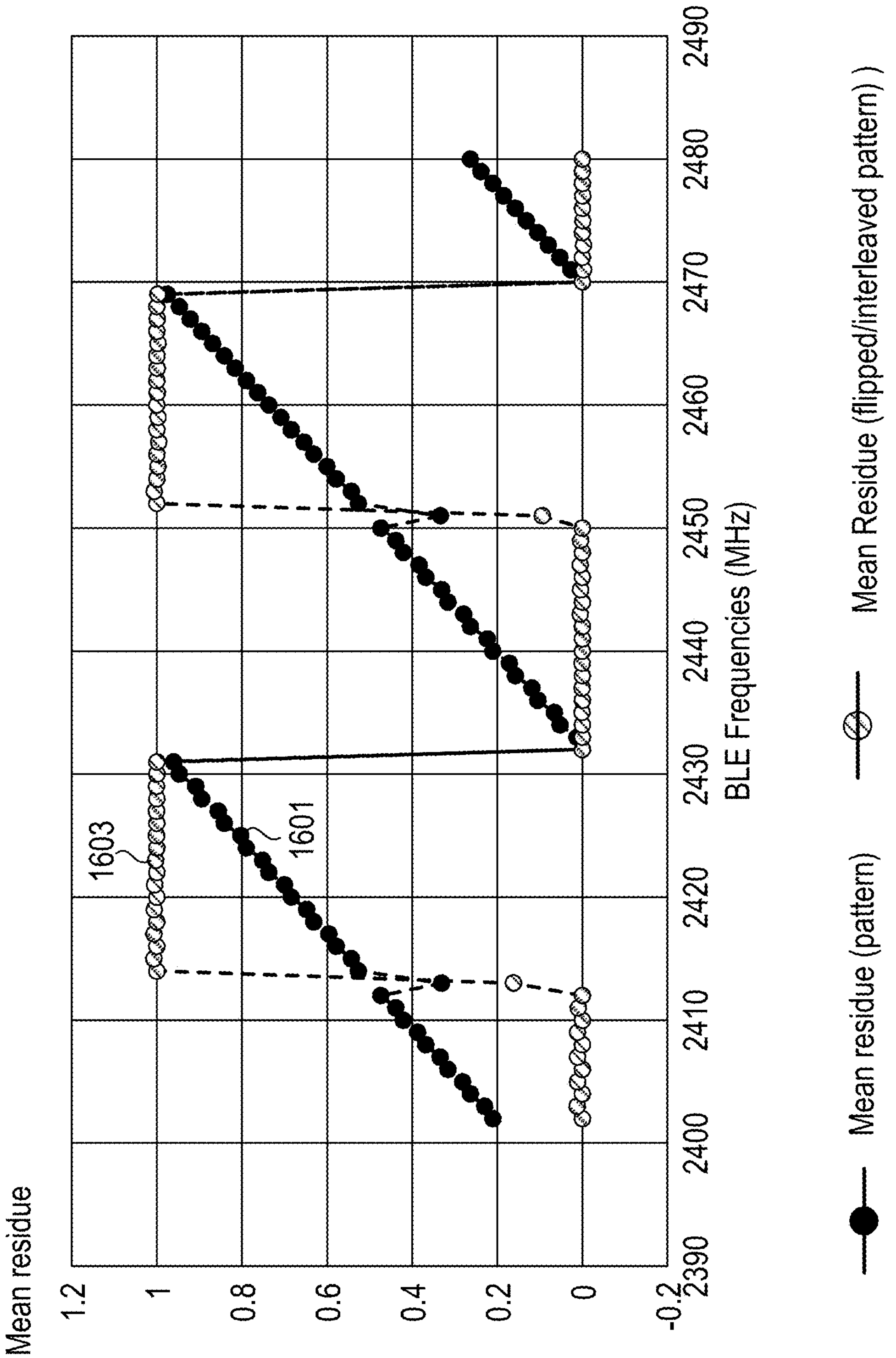
FIG. 16A illustrates the average residue versus BLE frequencies for an original MSE pattern and for a flipped/interleaved pattern.
Figure 16B:
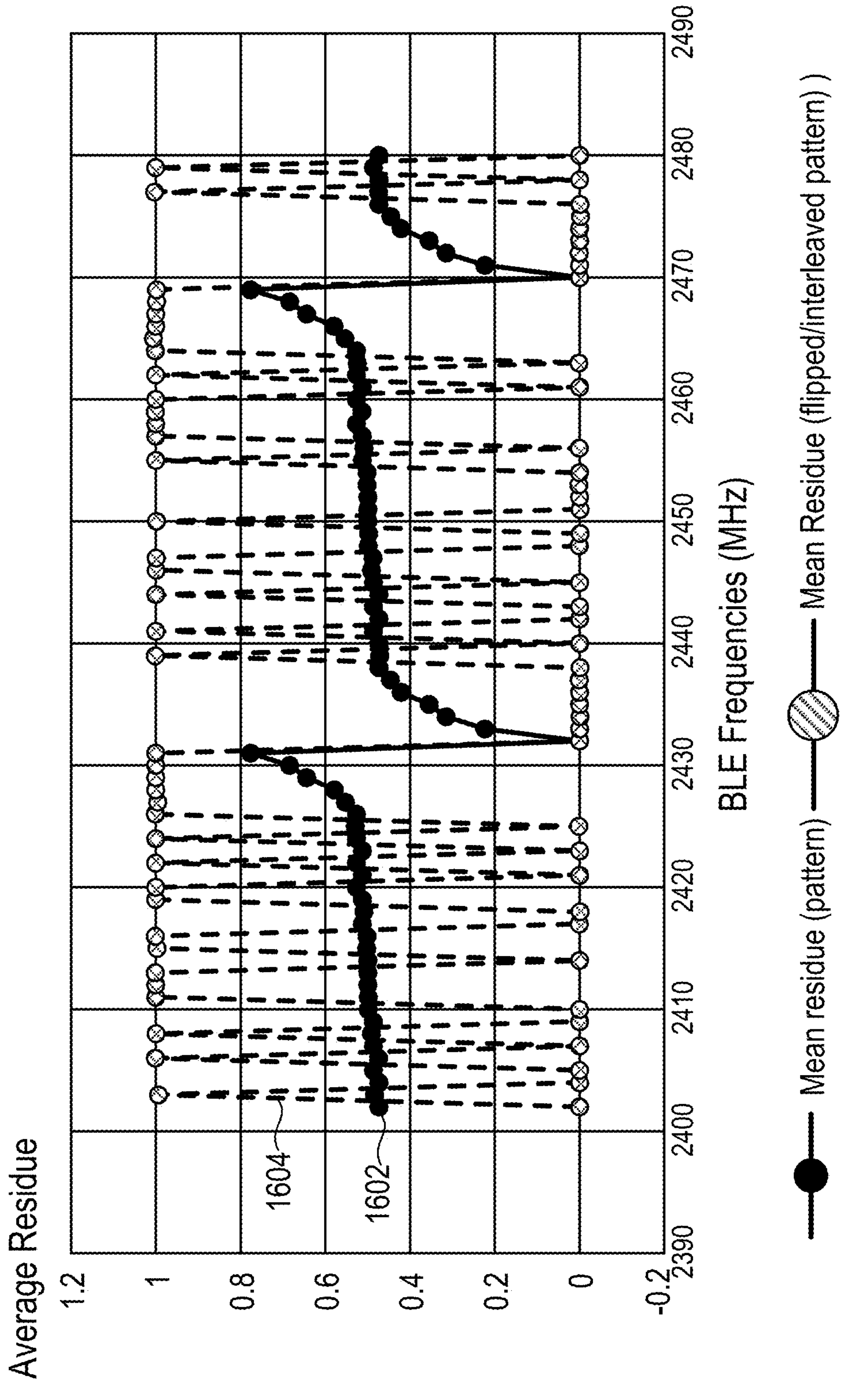
FIG. 16B shows average residue versus BLE frequency for an original pattern generated from a ΣΔ modulator and shows the average residue versus BLE frequency with the original pattern flipped and interleaved.

FIG. 16A illustrates simulation results showing the average residue versus BLE frequencies 1601 for an original MSE pattern and the average residue versus BLE frequencies 1603 for the flipped/interleaved pattern. The flipped/interleaved patterns have either average residues of 0 or 1 VCO cycle and therefore yield the same VCO output phase. One VCO cycle is 2π in terms of VCO cycles and thus the same as 0 residue. Similarly, FIG. 16B shows simulation results showing average residue 1602 versus BLE frequency for original patterns generated from a ΣΔ modulator and shows the average residue 1604 versus BLE frequency for flipped/interleaved patterns generated from a ΣΔ modulator. The flipped/interleaved patterns have either average residues of 0 or 1 VCO cycle and therefore yield the same VCO output phase.

Figure 17A:
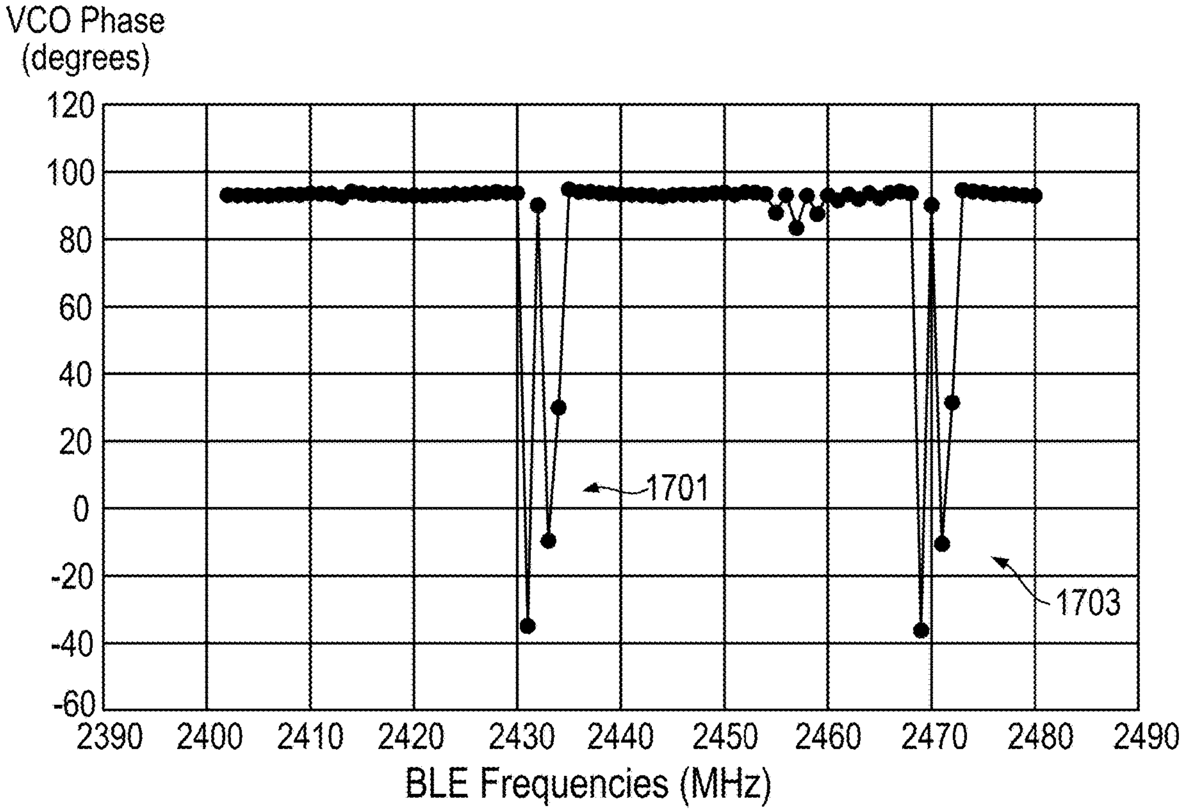
FIG. 17A shows VCO phase versus BLE frequency for a LA modulator generated MMD drive pattern that is flipped and interleaved.
Figure 17B:
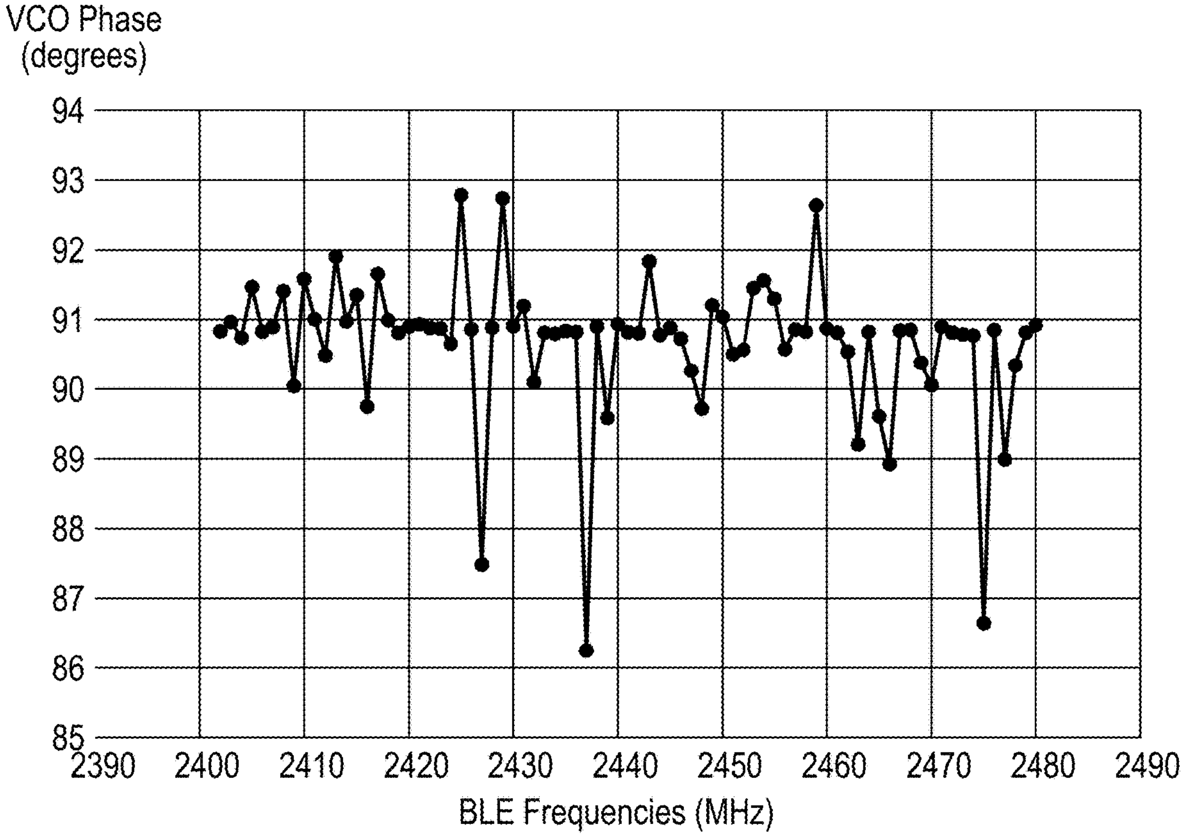
FIG. 17B shows VCO phase versus BLE frequency using an MMD drive pattern generated using an MSE linear fit approach that is flipped and interleaved.

FIG. 17A shows simulation results for VCO phase versus BLE frequency for a ΣΔ modulator generated MMD driving pattern that is flipped and interleaved for fref=38 MHz. The output phase can be seen to vary around 94 degrees. Several frequencies, e.g., at 1701 and 1703, exhibit deviations in phase from 94 degrees. The variation in the output phase can be reduced with a lower bandwidth PLL and/or use of QNC (and use of an MMD that is driven with a multibit ΣΔ, as known in the art). FIG. 17B illustrates using an MMD driving pattern generated using an MSE linear fit approach that is flipped and interleaved for BLE channels with fref=38 MHz. The phase can be seen to be close to 91 degrees with several BLE frequencies exhibiting greater changes in phase than other frequencies.

Figure 18:
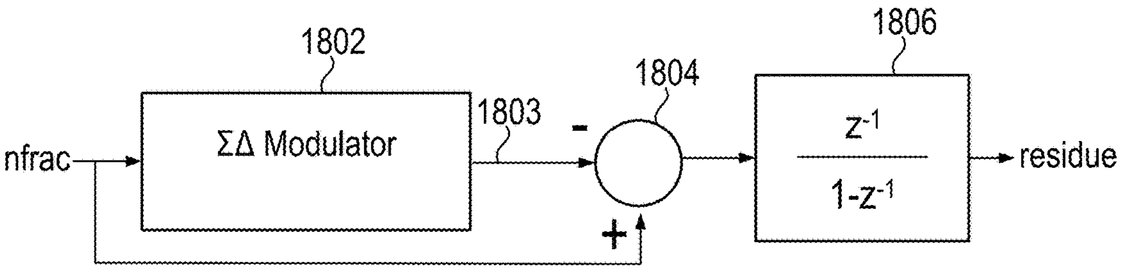
FIG. 18 illustrates the accumulation of error in a ΣΔ modulator.

Thus, one approach to generate patterns is to make the function an even function and in some cases interleave patterns. One challenge with such an approach is the requirement to have memory (non-volatile memory and/or RAM) to build up even and interleaved patterns on the fly. For correct frequency generation the ΣΔ modulator generates MMD drive patterns with a "1's density" that matches the desired fractional value. Rather than requiring even functions to drive the MMD, an alternative requirement for the average value of the residue to be zero is that the ΣΔ modulator's signal transfer function (STF)=1 as illustrated in FIG. 18. FIG. 18 shows the fractional value nfrac being supplied to the ΣΔ modulator 1802, which generates a divider control signal 1803. The summer 1804 generates an error term accumulated by the integrator 1806, which supplies an average residue value. For the average residue to be 0, the STF=1. That simplifies the solution by not having to accumulate patterns but simply generate patterns with a ΣΔ modulator having an STF=1. Note that the STF should not have a delay.

Figure 19:
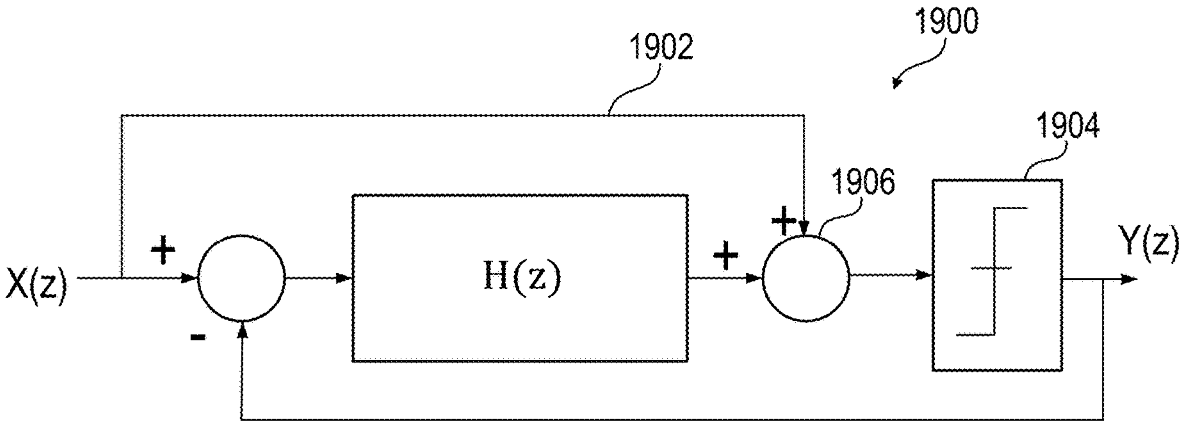
FIG. 19 illustrates a high level structure of a ΣΔ modulator that forces the average residue to zero.
Figure 20:
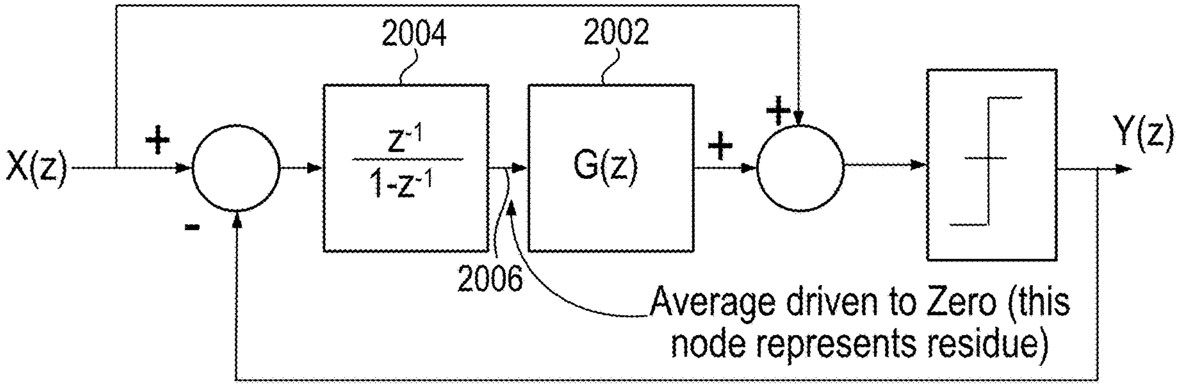
FIG. 20 illustrates a model of a ΣΔ modulator.

FIG. 19 illustrates a high level structure of a ΣΔ modulator 1900 that forces the average residue to zero. The feedforward path 1902 is coupled to the quantizer 1904 through the summer 1906 to ensure that H(z) only processes the error. Referring to FIG. 20, if H(z) in ΣΔ modulator 1900 is modeled as G(z) 2002 preceded by the integrator 2004, the output of the integrator at node 2006 is the residue. The average residue must be driven to zero since H(z) is only processing the converter error, which on average is zero.

Figure 21:
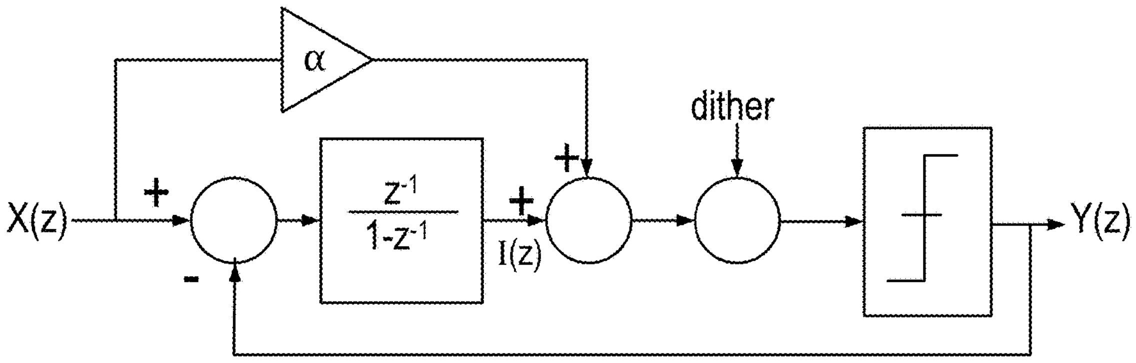
FIG. 21 illustrates an embodiment of a first order ΣΔ modulator that generates MMD patterns providing zero average residue that is used to achieve phase coherence in a fractional N PLL.

FIG. 21 illustrates an embodiment of a first order ΣΔ modulator that generates MMD patterns providing phase coherence if the ΣΔ modulator is initialized at an appropriate boundary condition. For the illustrated first order ΣΔ modulator:

$$STF(z)=\alpha+(1-\alpha)z^{-1}$$

$$\text{For } \alpha=1\text{: } I(z)=0.$$

$$\text{For } \alpha=0\text{: } I(z)=z^{-1}X(z).$$

$$\text{Thus, for } \alpha=1,\ STF=1.$$

Figure 22:
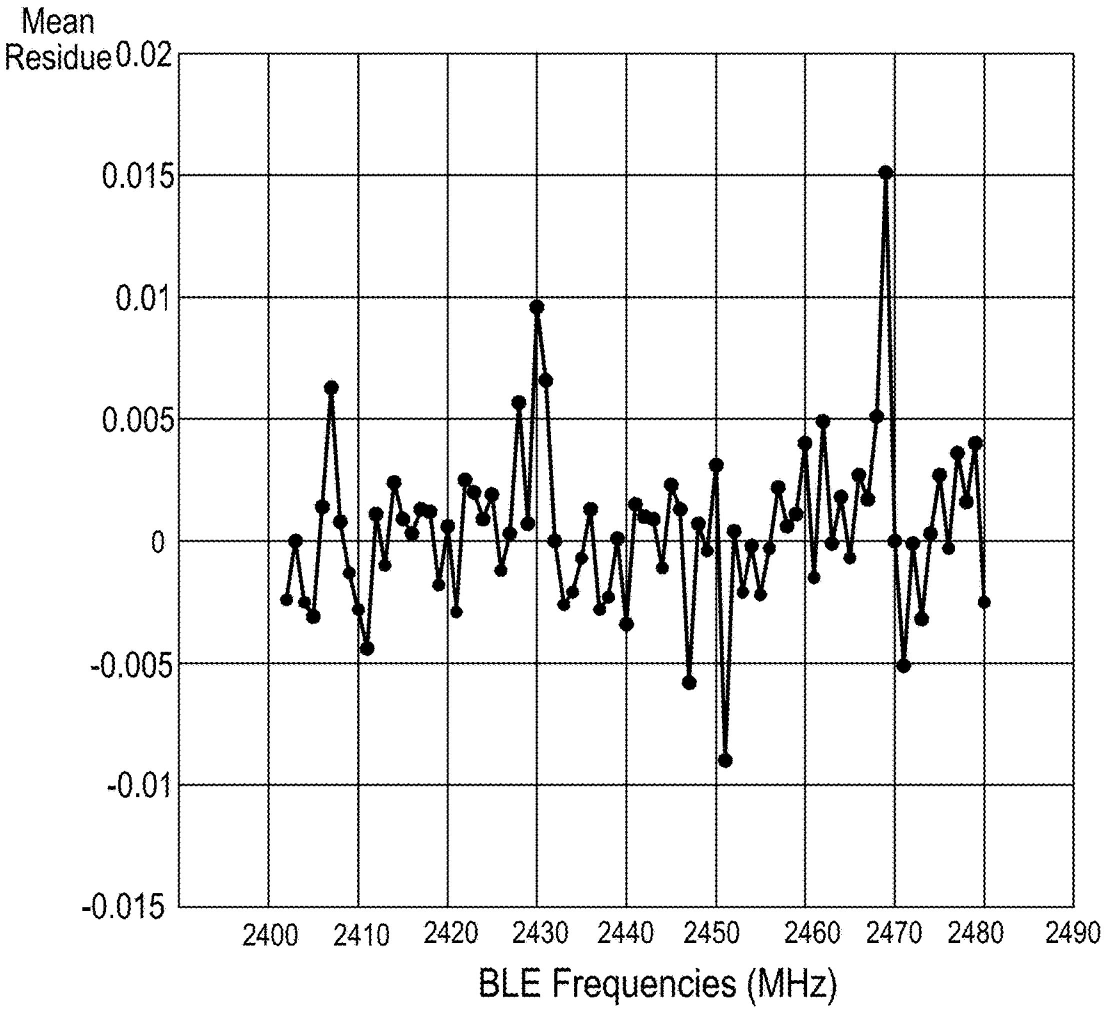
FIG. 22 shows that mean residue across BLE frequencies is very close to zero with a first order ΣΔ modulator having an STF=1.
Figure 23:
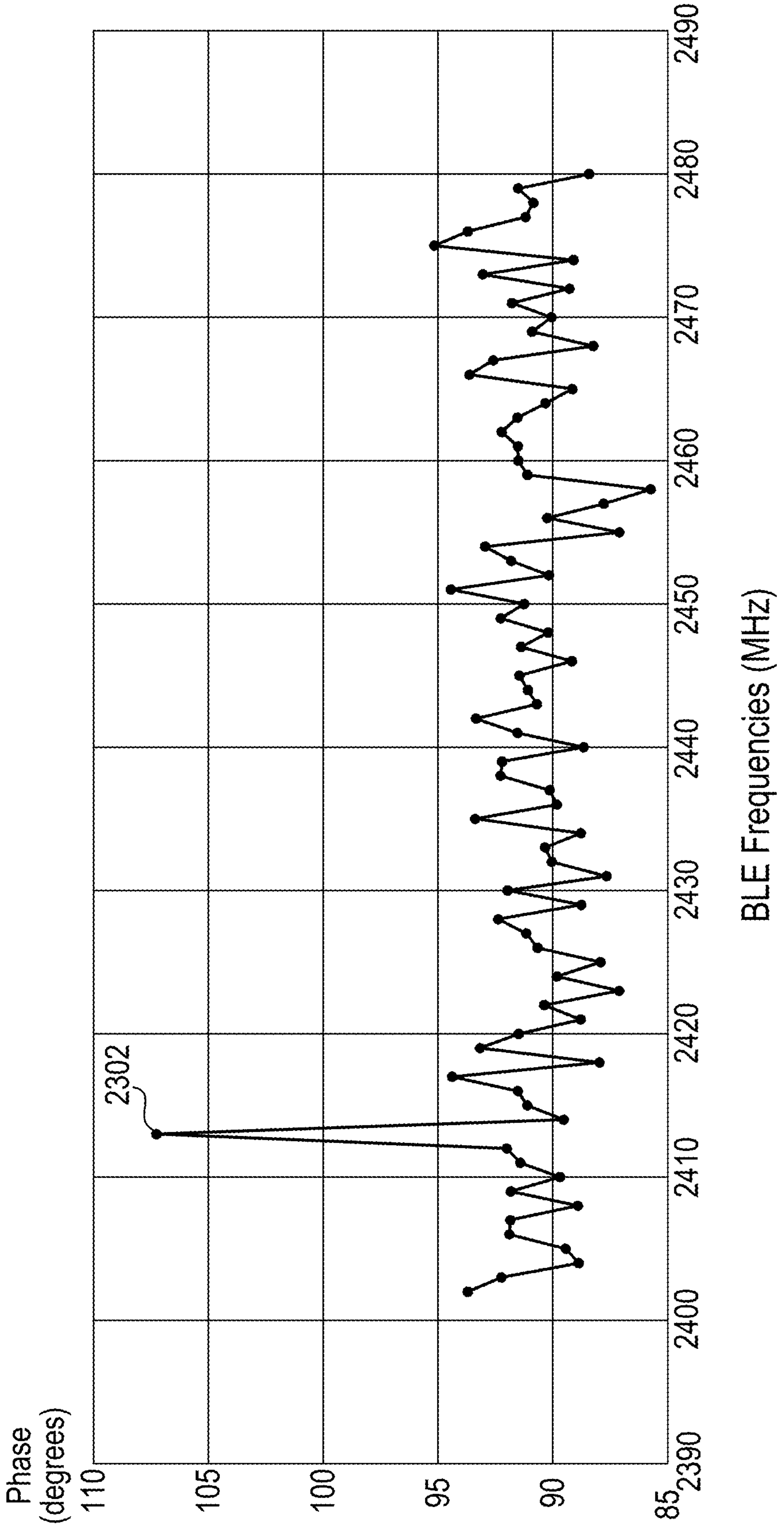
FIG. 23 shows phase versus BLE frequencies for a first order ΣΔ modulator with a STF=1.

FIG. 22 illustrates simulation results showing the mean residue pattern across BLE frequencies as being very close to zero with a first order ΣΔ modulator having an STF=1. FIG. 23 illustrates simulation results of an embodiment of a first order ΣΔ modulator with an STF=1 showing phase versus BLE frequencies for a reference frequency of 38 MHz. The phase can be seen to be substantially repeatable around 90 degrees within a margin of error. For N=63.5 at 2302 MHz, the phase consistency deviates from 90 degrees more than the other frequencies.

Figure 24:
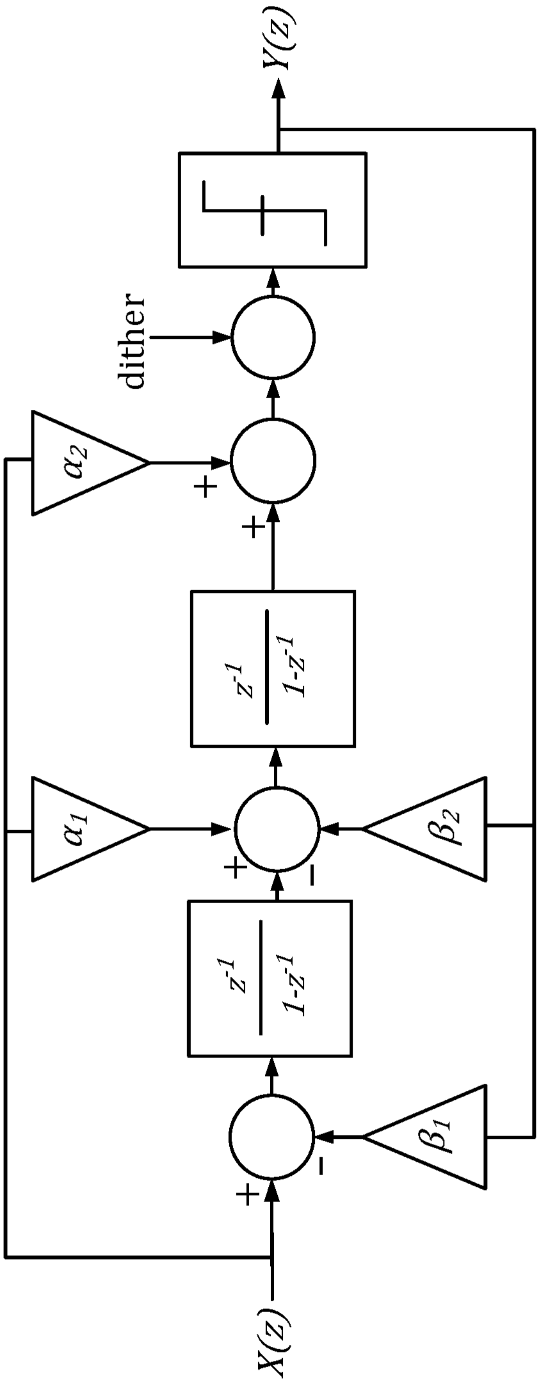
FIG. 24 illustrates an embodiment of a second order ΣΔ modulator that generates MMD patterns providing zero average residue that is used to achieve phase coherence in a fractional N PLL.
Figure 25:
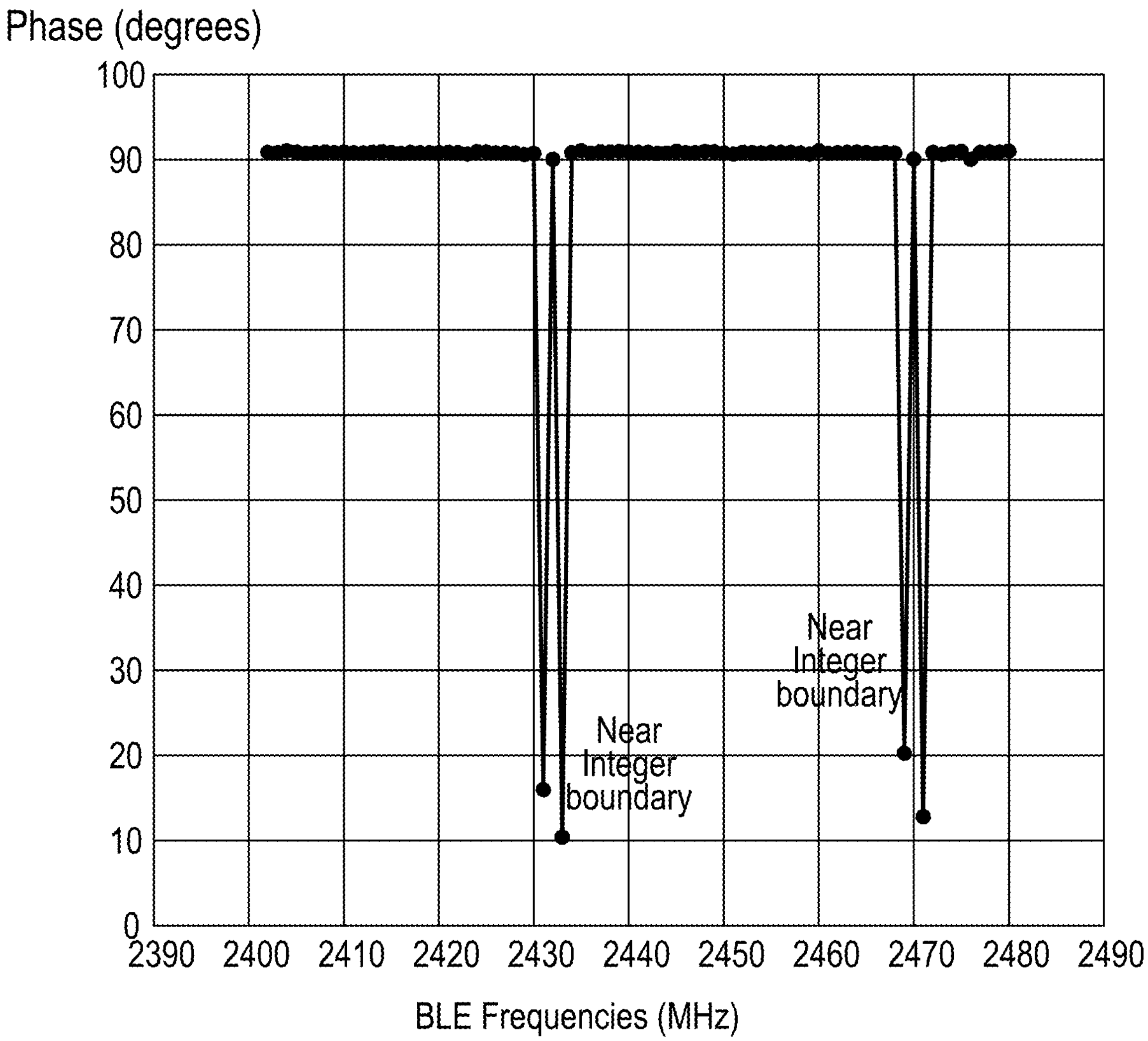
FIG. 25 shows VCO phase versus BLE frequency for a second order ΣΔ modulator with an STF=1.

FIG. 24 illustrates an embodiment of a second order ΣΔ modulator that generates MMD patterns providing phase coherence if the ΣΔ modulator is initialized at an appropriate boundary condition determined based on the reference clock frequency. FIG. 25 illustrates simulation results of VCO phase versus BLE frequency for a second order EA modulator with an STF=1 for a reference frequency (fref)=38 MHz. As can be seen in FIG. 25, the phase is substantially repeatable for almost all the BLE frequencies within a margin of error. Note that several frequencies deviate from the repeatable phase where the fractional divide values are close to integer values. A different reference frequency may eliminate those particular VCO phase results that are less consistent but result in other phase inconsistencies. Where a sigma delta pattern is tonal and has undesirable low frequency components one solution is to use a multi-bit MMD instead of just N/N+1. Other solutions including using a QNC or DTC or a very narrow bandwidth PLL.

As discussed above, for a 38 MHz reference frequency, all the BLE frequencies can have repeatable phase if patterns are started on appropriate boundaries equivalent to t=0. However, if the ΣΔ modulator is not started on a standard boundary for phase coherence (e.g., 1 μs or 5 μs depending on the reference frequency), as long as the start time is known with respect to the boundary, the VCO phase changes in a predictable way. That predictable VCO phase change can be exploited in a variety of ways.

For example, non-standard boundaries can be used for receiver compensated phase coherence. If the pattern start cannot be aligned to the standard boundary, the time difference between the standard boundary and the pattern start can be measured and used to calculate the phase offset. The boundary spacing grows with finer resolution. Finer resolution may be desired for frequency offset correction without waiting for long times to align with a boundary. In an embodiment, the phase coherence correction term (calculated phase offset) is transmitted separately to a receiver in a data packet. The receiver then uses the phase coherence correction term to correct its angle measurements of the received non phase coherent tones for increased accuracy in distance measurements.

In general (τ/T_boundary)*360=change in VCO phase (degrees), where t is the time difference from the standard boundary and T_boundary is the interval between standard boundary times (e.g., 1 μs or 5 μs). For example, assume a 38 MHz reference frequency and standard boundaries occur every 1 μs. If the MMD pattern starts at 0.1 μs after the standard boundary, the VCO phase change will be (0.1 μs/1 μs)×360=36 degrees. The transmitter sends the phase offset of 36° to the receiver and the receiver adjusts its measurement of the phase based on the transmitted phase offset.

Transmitting on a non-standard boundary can also be used for transmitter compensated phase coherence. By transmitting off the standard boundaries, a transmitter can use the known phase change to correct for sources of phase offset, such as patterns that do not have 0 mean residue or have a frequency offset. For example, FIG. 17A shows frequencies near integer multiples of the reference 1701, 1703 do not have the same phase offset as other frequencies. For the frequency with a phase offset of approximately −37°, by transmitting at (95°-37°)/360*1 us=+366 ns after the standard boundary, the timing offset cancels the phase offset and makes the switch phase coherent. Accounting for frequency offset with non-boundary aligned switching allows for phase coherent frequency switch to any arbitrary frequency, rather than those defined by the frequency/boundary grid.

Figure 26:
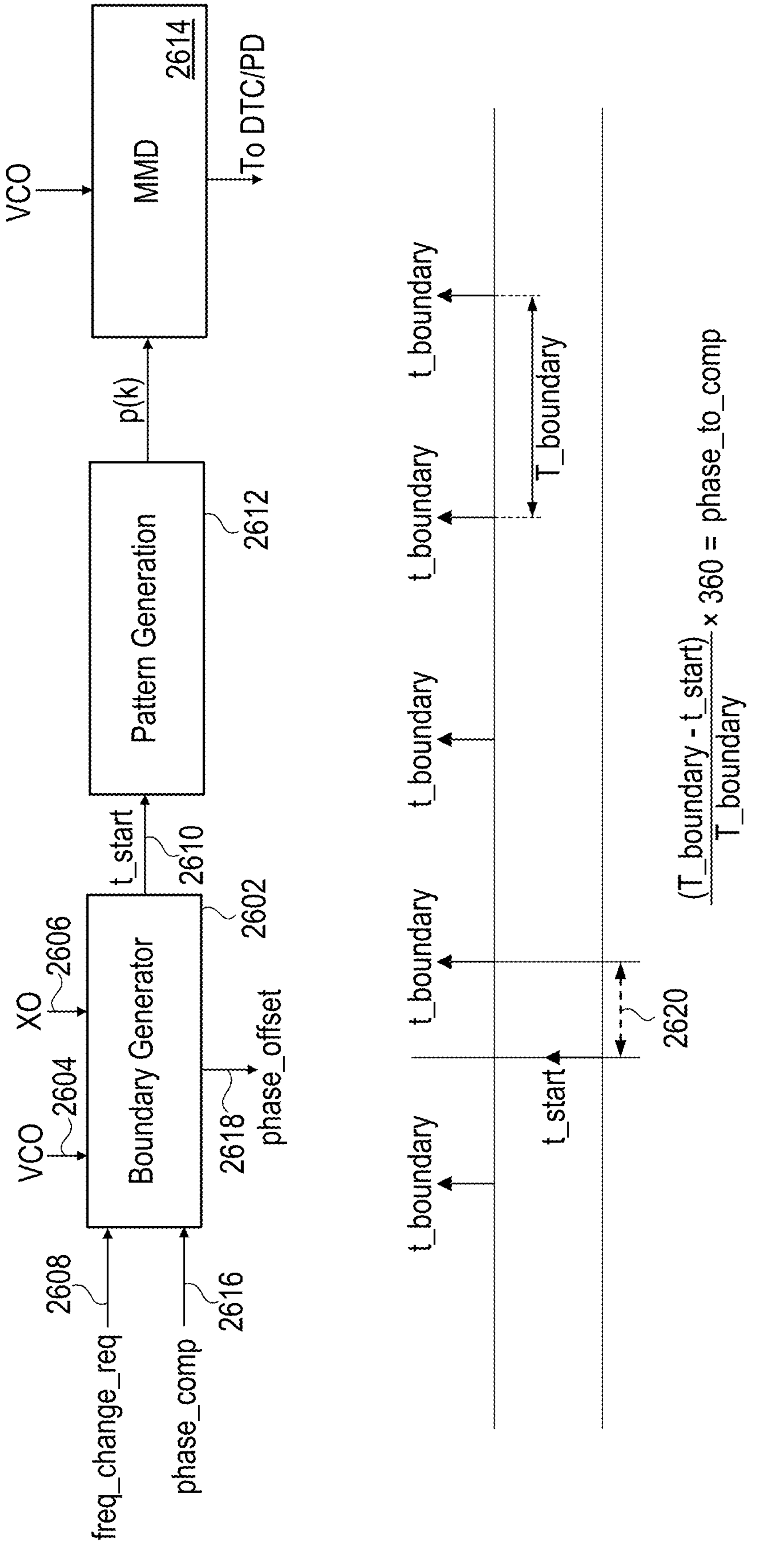
FIG. 26 illustrates a high level block diagram of an embodiment that allows for EA modulator start times at both standard boundary times (equivalent to t=0) and at non-standard boundary times.

FIG. 26 illustrates a high level block diagram of an embodiment that allows for ΣΔ modulator start times at both standard boundary times and at non-standard boundary times resulting in a known phase change. The boundary generator block 2602 is a digital block that calculates the times where phase coherence switching can occur (e.g., every 1 μs or 5 μs) based on the frequency of the VCO signal 2604 and the frequency of the reference clock signal 2606. In the simplest case, the boundary generator 2602 receives the frequency change request signal 2608 and aligns the change with the next boundary so that the frequency change is phase coherent. The boundary generator supplies a t_start signal 2610 to the pattern generation block 2612 to start supplying patterns p(k) for the new frequency to the MMD 2614. The pattern generation block utilizes any of the techniques described for driving the MMD such as a ΣΔ modulator with an STF=1, a memory circuit with stored patterns from an even function that is flipped and interleaved, a pattern generator that uses a linear polynomial to generate an MMSE pattern, or any other appropriate method to supply the pattern. While a full PLL is not shown for ease of illustration, the MMD 2614 is part of a PLL, such as one of the fractional-N PLLs described above.

When the boundary generator block 2602 operates in the transmit (TX) phase compensation mode, the boundary generator block 2602 adjusts the pattern generation start time, t_start to an offset from the standard boundary (t_boundary) to compensate for the requested phase adjustment. Thus, given the requested phase compensation supplied on phase compensation signal line 2616, the offset τ is based on phase offset=(τ/T_boundary)*360. Since the desired phase offset is given and the boundary time (T_boundary) is known, the offset τ can be readily calculated.

When the boundary generator block 2602 operates in the RX phase compensation mode, the freq_change_req trigger is immediately passed to the pattern generation as t_start without waiting for the next boundary alignment. The time between t_start and the boundary is measured and returned as phase offset 2618 to be used as a value sent to the receiver to compensate the receiver for the phase offset. Specifically FIG. 26 shows the phase to compensate is calculated as $$\frac{T_{boundary} - t_{start}}{T_{boundary}} \times 360 \text{ (or } 2\pi) = \text{phase to comp}$$

The value of phase_to_comp is shown graphically as 2620, which is the distance that t_start comes early before the next standard boundary time.

Figure 27:
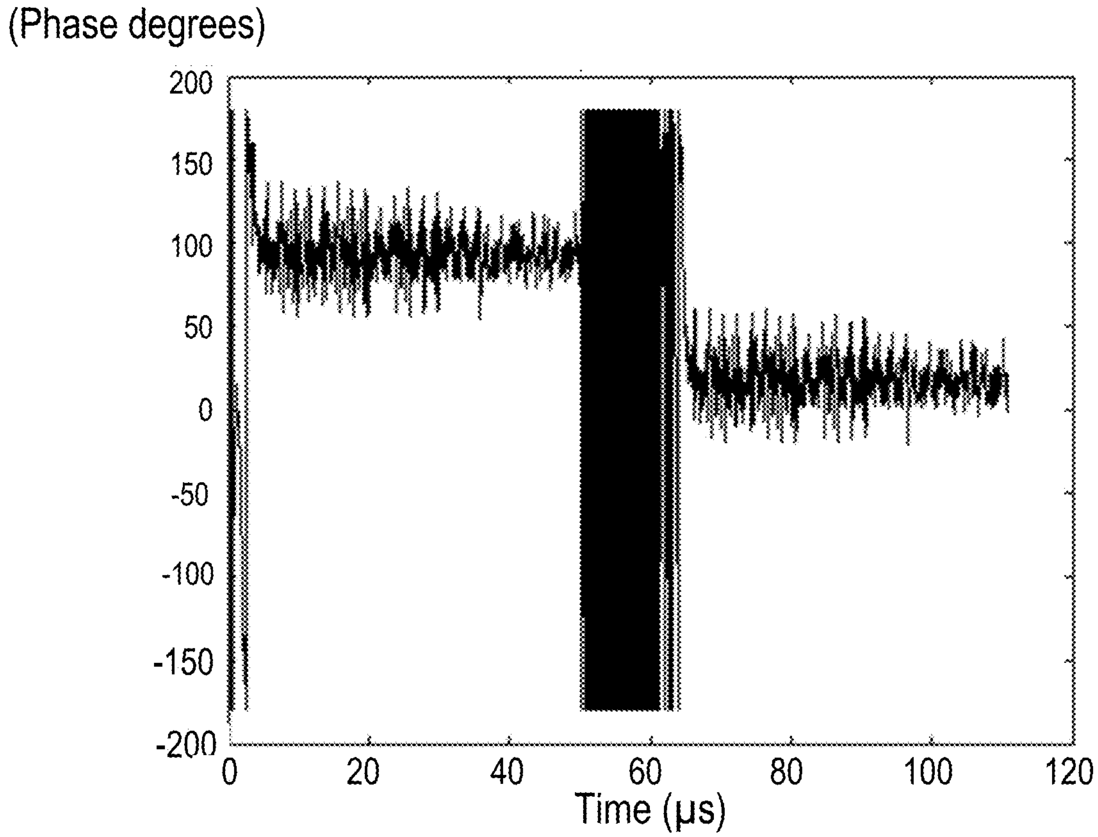
FIG. 27 illustrates phase versus time for VCO frequency changing on a nonstandard boundary.
Figure 28:
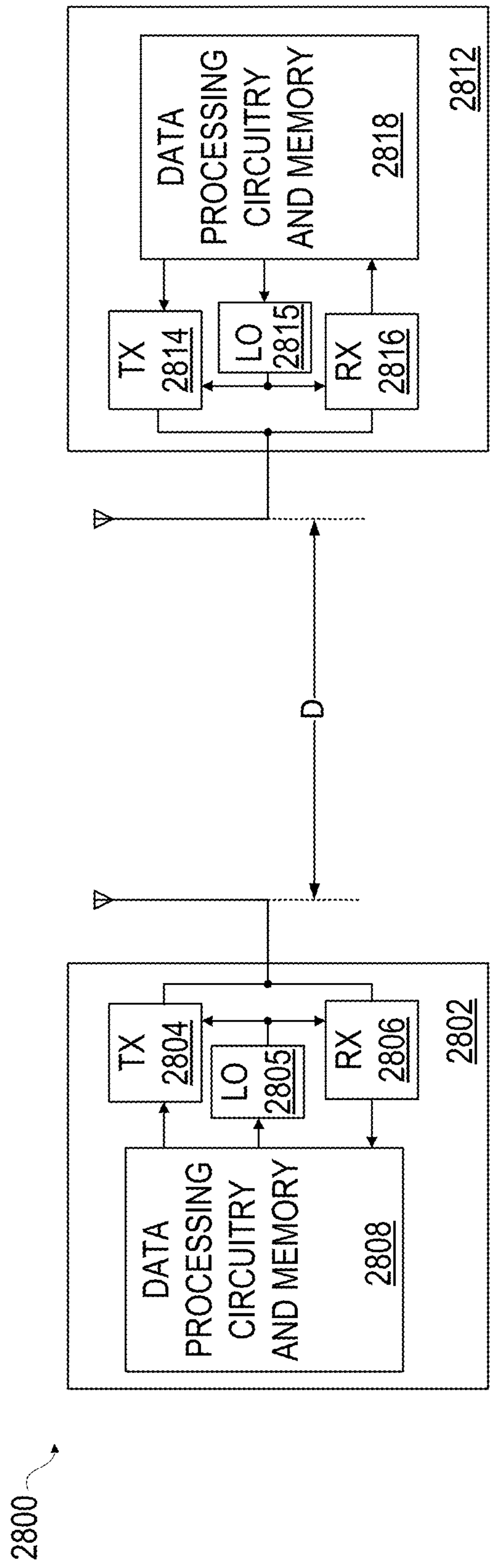
FIG. 28 illustrates a high level block diagram of a transmitter/receiver pair that incorporate at least one embodiment of the phase coherence approach described herein.

FIG. 27 illustrates phase versus time simulation results of the VCO frequency changing on a nonstandard boundary. The reference frequency=38 MHz and the VCO frequency generated is 2452 MHz. The average phase from 0≤t≤50 μs is 93.2 degrees based on the MMD drive pattern supplied by the pattern generation block 2612. From 50 to 60.1 μs a pattern of zeros is used. At t>60.1 μs the pattern generation block applies the original MMD drive pattern. The average phase changes to 131.5 degrees from 93.2 after 60.1 μs. The new phase is a delta of 38.3 degrees from the original phase. That is close to the expected change of 36 degrees (0.1 μs/1 μs)×360=36 degrees). Of course, starting at the standard boundary of 60 μs instead of 60.1 μs results in no phase change. Ensuring phase coherence for the local oscillator is particularly useful for high accuracy distance measurements (HADM) in BLE. FIG. 28 illustrates a high level block diagram of a transmitter/receiver pair that measure the distance D between them using one way or two way distance measurements. The wireless communications system 2800 includes communications device 2802, which includes transmitter 2804 and receiver 2806, and communications device 2812, which includes transmitter 2814 and receiver 2816. A distance D separates communications device 2802 from communications device 2812. In an embodiment, wireless communications system 2800 is compliant with the BLE communications protocol designed for low power and low latency applications. Local oscillator (LO) 2805 and local oscillator 2815 provide signals used in transceiver functions of communications device 2802 and communications device 2812, respectively, and are formed by one of the PLLs described herein. In addition, one or both of the communications devices include the boundary generator and pattern generation functionality shown in FIG. 26. Processing circuitry and memory 2808 and 2818 may be used, e.g., as part of the boundary generator logic 2802 and/or part of generating an MMSE linear polynomial as a drive pattern source or other MMD drive patterns that have been described. The memory may include non-volatile memory, random access memory, or both. In an embodiment, the memory stores patterns to drive the MMD of the PLL forming the local oscillator. The patterns may be stored in NVM or generated on the fly and stored in RAM. In an embodiment, in RX compensation mode, the device 2802 transmits the phase correction term to the device 2812. The device 2812 then adjusts its phase measurements based on the phase correction term to obtain accurate distance measurements.

Thus, embodiments to provide phase coherence have been described. The description of the invention set forth herein is illustrative and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:

a fractional-N phase-locked loop (PLL) coupled to receive a reference clock signal and supply an output signal and wherein the PLL includes a multi-modulus divider coupled in a feedback path of the PLL;

a multi-modulus pattern generator to supply a first drive pattern to the multi-modulus divider; and wherein supplying the first drive pattern to the multi-modulus divider is initiated at a first boundary time to switch from a first frequency of a plurality of output frequencies to a second frequency of the plurality of output frequencies while maintaining a known phase relationship between the output signal at the second frequency and the reference clock signal and while maintaining a known phase relationship between the output signal at the second frequency and the output signal at the first frequency.

2. The apparatus as recited in claim 1 wherein a second drive pattern is supplied to the multi-modulus divider at a time offset from a second boundary time responsive to a requested phase adjustment of the output signal.

3. The apparatus as recited in claim 2 further comprising a boundary generator to provide an indication of boundary times, the boundary times including the first boundary time and the second boundary time and wherein each of the boundary times is separated from a previous boundary time by a boundary time interval corresponding to a predetermined number of reference clock cycles.

4. The apparatus as recited in claim 1 further comprising a sigma delta modulator to supply drive patterns for the plurality of output frequencies, the drive patterns including the first drive pattern, and the sigma delta modulator has a signal transfer function (STF) equal to one.

5. The apparatus as recited in claim 4 wherein the drive patterns have an average residue equivalent to zero.

6. The apparatus as recited in claim 5 wherein the first drive pattern supplied to the multi-modulus divider has an original portion with a ones density corresponding to the second frequency and a mirror image of the original portion and the original portion and the mirror image are interleaved.

7. The apparatus as recited in claim 4 wherein the drive patterns supplied to the multi-modulus divider are even functions.

8. The apparatus as recited in claim 1 further comprising a plurality of sigma delta modulators to supply drive patterns to the multi-modulus divider.

9. The apparatus as recited in claim 8 wherein one of the sigma delta modulators is utilized to supply drive patterns at odd boundary times and another of the sigma delta modulators is utilized to supply drive patterns at even boundary times.

10. The apparatus as recited in claim 1 wherein the multi-modulus divider is a multi-bit multi-modulus divider.

11. A method for generating an output signal comprising:

supplying a drive pattern to a multi-modulus divider of a fractional-N phase locked loop to achieve a desired change in frequency of the output signal from a first frequency of a plurality of output frequencies to a second frequency of the plurality of output frequencies;

initiating supplying the drive pattern at a boundary time or at a time offset from the boundary time;

wherein initiating the drive pattern at the boundary time causes the output signal at the second frequency to have a first phase and a known phase relationship with the output signal at the first frequency, the first frequency being any one of the plurality of output frequencies and the second frequency being any other of the plurality of output frequencies; and wherein supplying the drive pattern to the multi-modulus divider at the time offset from the boundary time is responsive to a phase compensation request and causes the output signal to have a second phase that is phase offset from a first phase by a phase amount corresponding to the time offset from the boundary time.

12. The method as recited in claim 11 further comprising:

supplying the drive pattern from a sigma delta modulator; and resetting state variables of the sigma delta modulator to a known state prior to supplying the drive pattern at the boundary time.

13. The method as recited in claim 11 further comprising:

supplying a reference clock signal to a fractional-N phase-locked loop; and determining the boundary time by counting a boundary time interval from a previous boundary time, the boundary time interval being a predetermined number of cycles of the reference clock signal.

14. The method as recited in claim 11 generating the drive pattern supplied to the multi-modulus divider using an original portion with a ones density corresponding to the second frequency that is interleaved with a mirror image portion of the original portion.

15. The method as recited in claim 11 further comprising generating the drive pattern supplied to the multi-modulus divider as an even function.

16. The method as recited in claim 11 further comprising supplying the drive pattern from a sigma delta modulator having a signal transfer function (STF) equal to one.

17. The method as recited in claim 11 further comprising:

supplying the drive pattern from a first delta sigma modulator for the first frequency; and responsive to a request to change to a second frequency of the plurality of output frequencies, activating a second delta sigma modulator to supply a second drive pattern corresponding to the second frequency.

18. An apparatus comprising:

a fractional-N phase-locked loop (PLL) to generate an output signal having any one of a plurality of output frequencies and the PLL is coupled to receive a reference clock signal;

a pattern generator to supply drive patterns to a multi-modulus divider of the PLL, each of the drive patterns corresponding to one of the output frequencies; and wherein the pattern generator initiates supplying one of the respective drive patterns to the multi-modulus divider at a time offset from one of a plurality of boundary times, each of the boundary times separated from a previous boundary time by a boundary time interval corresponding to a predetermined number of reference clock cycles; and wherein a phase offset corresponding to the time offset from the one of the plurality of boundary times is transmitted to a receiver.

19. The apparatus as recited in claim 18 wherein the pattern generator initiates supplying another one of the drive patterns to the multi-modulus divider at one of the boundary times resulting in the output signal having one of the output frequencies and the output signal having phase coherence with the output signal at different frequencies generated using different ones of the drive patterns.

20. The apparatus as recited in claim 18 wherein the pattern generator initiates supplying another one of the drive patterns to the multi-modulus divider at a second time offset from another one of the boundary times thereby achieving transmitter compensated phase coherence.

* * * * *